US011567127B2

(12) United States Patent
Bienfang

(10) Patent No.: US 11,567,127 B2
(45) Date of Patent: Jan. 31, 2023

(54) TEMPORAL JITTER ANALYZER AND ANALYZING TEMPORAL JITTER

(71) Applicant: Government of the United States of America, as represented by the Secretary of Commerce, Gaithersburg, MD (US)

(72) Inventor: Joshua Copeland Bienfang, Bethesda, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 42 days.

(21) Appl. No.: 17/223,554

(22) Filed: Apr. 6, 2021

(65) Prior Publication Data

US 2021/0311119 A1 Oct. 7, 2021

Related U.S. Application Data

(60) Provisional application No. 63/005,584, filed on Apr. 6, 2020.

(51) Int. Cl.
*G01R 31/317* (2006.01)
*H03K 5/133* (2014.01)

(52) U.S. Cl.
CPC . *G01R 31/31709* (2013.01); *G01R 31/31727* (2013.01); *H03K 5/133* (2013.01)

(58) Field of Classification Search
CPC ........ G01R 31/31709; G01R 31/31727; H04L 49/9023; H04L 1/205; H04L 43/087; G05B 2219/25249; H03M 1/0863; H03K 5/133
See application file for complete search history.

(56) References Cited

U.S. PATENT DOCUMENTS

2002/0198672 A1* 12/2002 Jungerman .......... G01R 13/345
702/106
2003/0081667 A1* 5/2003 Camnitz ................. H04L 1/205
375/226

(Continued)

OTHER PUBLICATIONS

Oiwa et al. "Experimental demonstration of timing jitter reduction based on the temporal talbot effect using LCFBGs," 2008 Conference on Lasers and Electro-Optics and 2008 Conference on Quantum Electronics and Laser Science, San Jose, CA, USA, 2008, pp. 1-2. (Year: 2008).*

(Continued)

*Primary Examiner* — Cynthia Britt
(74) *Attorney, Agent, or Firm* — Office of Chief Counsel for National Institute of Standards and Technology

(57) ABSTRACT

A temporal jitter analyzer analyzes temporal jitter and includes: a time delay controller; a time delay member; a delay measurement circuit; an edge generator in communication with the time delay member and that receives the delayed primary signal from the time delay member and produces a reference signal from the delayed primary signal; a decision circuit in communication with the edge generator and that: receives the reference signal from the edge generator; receives a detector signal; and produces a raw decision signal from the detector signal such that a value of the raw decision signal depends on the reference signal; and a decision circuit readout in communication with the edge generator and the decision circuit and that: receives the reference signal from the edge generator; receives the raw decision signal from the decision circuit; and produces a decision signal from the raw decision signal based on the reference signal.

20 Claims, 16 Drawing Sheets

(56) References Cited

U.S. PATENT DOCUMENTS

| | | | | |
|---|---|---|---|---|
| 2005/0218881 A1* | 10/2005 | Tanaka | ............ | G01R 29/26 |
| | | | | 324/76.77 |
| 2005/0280458 A1* | 12/2005 | Leung | ............ | H02M 3/33576 |
| | | | | 327/172 |
| 2006/0122806 A1* | 6/2006 | Rifani | ............ | G01R 29/0273 |
| | | | | 702/177 |
| 2009/0096439 A1* | 4/2009 | Hsu | ............ | G01R 29/26 |
| | | | | 324/76.52 |
| 2019/0004565 A1* | 1/2019 | Nelson | ............ | G06F 1/10 |

OTHER PUBLICATIONS

Le Blanc, S. P., et al., "Spectral, temporal, and spatial characteristics of plasma-induced spectral blue shifting and its application to femtosecond pulse measurement", Journal of the Optical Society of America B, 1996, p. 72-88. vol. 13 No.1.

Becker-Hickl, "Extreme-Resolution Version of SPC-150N, The TCSPC Module for Superconducting NbN Detectors" doi: https://www.becker-hickl.com/products/spc-150nxx/. Accessed Jan. 27, 2021.

Calandri, N., et al., "Superconducting nanowire detector jitter limited by detector geometry", Applied Physics Letters, 2016, p. 152601, vol. 109.

You, L., et al., "Jitter analysis of a superconducting nanowire single photon detector", AIP Advances, 2013, p. 072135, vol. 3.

\* cited by examiner

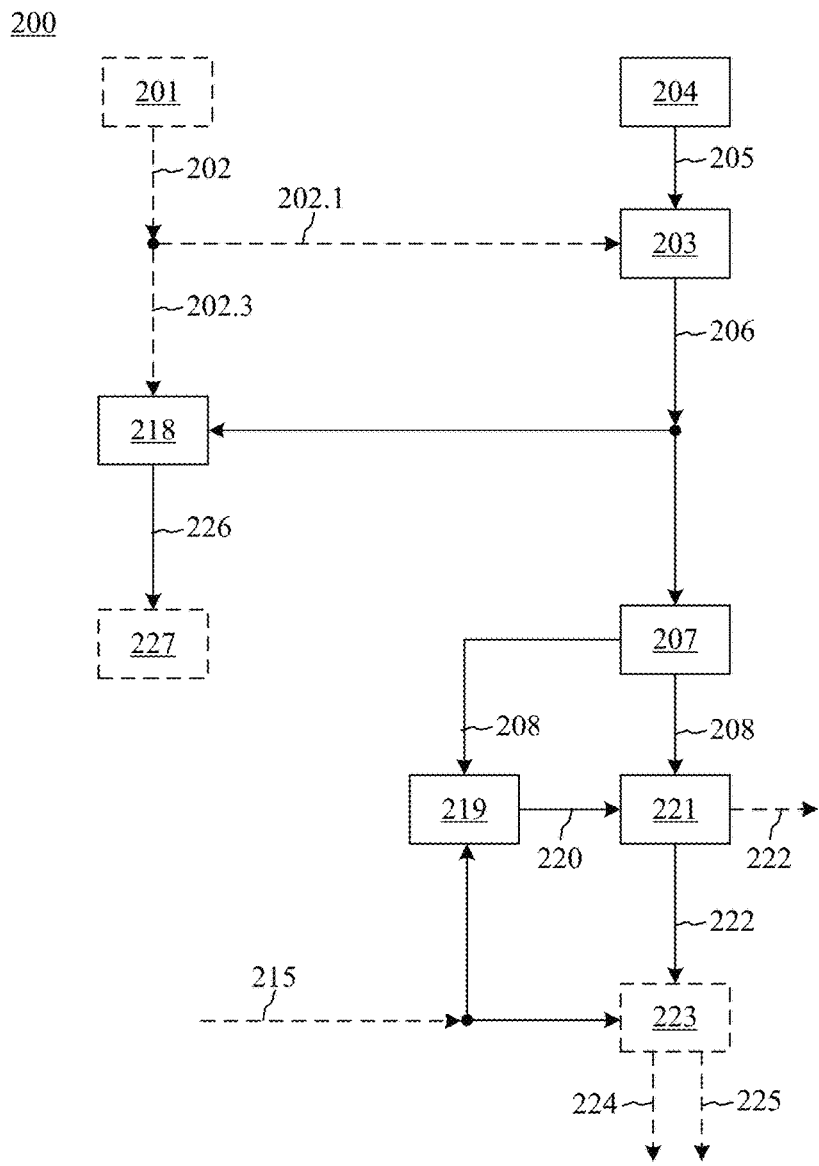

Legend:
temporal jitter analyzer 200
signal generator 201
primary signal 202
time delay member 203
time delay controller 204
control signal 205
delayed primary signal 206
edge generator 207
reference signal 208
detector signal 215
delay measurement circuit 218
decision circuit 219
raw decision signal 220
decision circuit readout 221
decision signal 222
countable pulse generator 223
early pulse 224
late pulse 225
time delay measurement signal 226
data medium 227

FIG. 1

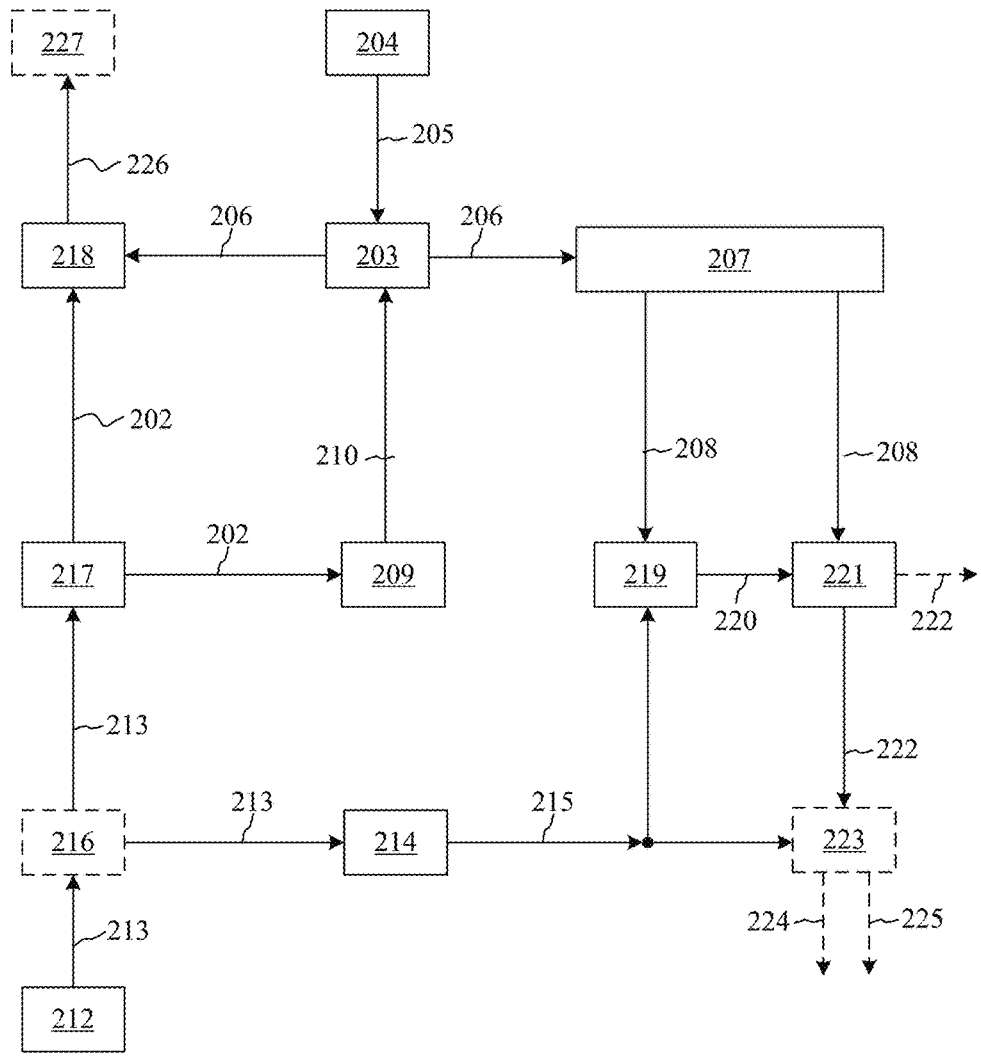

Legend:
temporal jitter analyzer 200 · signal generator 201 · primary signal 202
time delay member 203 · time delay controller 204 · control signal 205
delayed primary signal 206 · edge generator 207 · reference signal 208
frequency divider 209 · stimulus drive signal 210 · amplifier 211
optical source 212 · photon pulse 213 · detector 214
detector signal 215 · optical beam splitter 216 · primary photon detector 217
delay measurement circuit 218 · decision circuit 219 · raw decision signal 220
decision circuit readout 221 · decision signal 222 · countable pulse generator 223
early pulse 224 · late pulse 225
time delay measurement signal 226 · data medium 227

FIG. 3

Time knife phase circuit

TEMPORAL JITTER ANALYZER AND ANALYZING TEMPORAL JITTER

CROSS REFERENCE TO RELATED APPLICATIONS

The application claims priority to U.S. Provisional Patent Application Ser. No. 63/005,584 filed Apr. 6, 2020, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 20-016US1.

BRIEF DESCRIPTION

Disclosed is a temporal jitter analyzer for analyzing temporal jitter, the temporal jitter analyzer comprising: a time delay controller that produces a control signal; a time delay member in communication with the time delay controller and that: receives the control signal from the time delay controller; receives a first primary signal; and produces a delayed primary signal from the first primary signal such that delayed primary signal is delayed from first primary signal based on control signal; a delay measurement circuit in communication with the time delay member and that: receives the delayed primary signal from the time delay member; receives a third primary signal; and produces a time delay measurement signal from the first primary signal and the third primary signal; an edge generator in communication with the time delay member and that receives the delayed primary signal from the time delay member and produces a reference signal from the delayed primary signal; a decision circuit in communication with the edge generator and that: receives the reference signal from the edge generator; receives a detector signal; and produces a raw decision signal from the detector signal such that a value of the raw decision signal depends on the reference signal; and a decision circuit readout in communication with the edge generator and the decision circuit and that: receives the reference signal from the edge generator; receives the raw decision signal from the decision circuit; and produces a decision signal from the raw decision signal based on the reference signal.

Disclosed is a temporal jitter analyzer for analyzing temporal jitter, the temporal jitter analyzer comprising: a time delay controller that produces a control signal; a time delay member in communication with the time delay controller and a frequency divider and that: receives the control signal from the time delay controller; receives a stimulus drive signal from the frequency divider; and produces a delayed primary signal from the stimulus drive signal; a delay measurement circuit in communication with the time delay member and a primary photon detector and that: receives the delayed primary signal from the time delay member; receives a primary signal from the primary photon detector; and produces a time delay measurement signal from the delayed primary signal and the primary signal; an optical source that produces a photon pulse; the primary photon detector in communication with the optical source and the delay measurement circuit and that: receives the photon pulse; and produces the primary signal from the photon pulse; a frequency divider in communication with the primary photon detector and the photon pulse and that: receives the primary signal from the primary photon detector; produces the stimulus drive signal from the primary signal; and communicates the stimulus drive signal to the time delay member; a detector in communication with the optical source and that receives the photon pulse a produces a detector signal from the photon pulse; an edge generator in communication with the time delay member and that receives the delayed primary signal from the time delay member and produces a reference signal from the delayed primary signal; a decision circuit in communication with the edge generator and the detector and that: receives the reference signal from the edge generator; receives the detector signal from the detector; and produces a raw decision signal from the detector signal such that a value of the raw decision signal depends on the reference signal; and a decision circuit readout in communication with the edge generator and the decision circuit and that: receives the reference signal from the edge generator; receives the raw decision signal from the decision circuit; and produces a decision signal from the raw decision signal based on the reference signal.

Disclosed is a process for analyzing temporal jitter, the process comprising: producing, by a time delay controller, a control signal; receiving, by a time delay member, the control signal from the time delay controller; receiving, by the time delay member, a first primary signal; producing, by the time delay member, a delayed primary signal from the first primary signal such that delayed primary signal is delayed from first primary signal based on control signal; receiving, by a delay measurement circuit, the delayed primary signal from the time delay member; receiving, by the delay measurement circuit, a third primary signal; producing, by the delay measurement circuit, a time delay measurement signal from the first primary signal and the third primary signal; receiving, by an edge generator, the delayed primary signal from the time delay member; producing, by the edge generator, a reference signal from the delayed primary signal; receiving, by a decision circuit, the reference signal from the edge generator; receiving, by the decision circuit, detector signal; producing, by the decision circuit, a raw decision signal from the detector signal such that a value of the raw decision signal depends on the reference signal; receiving, by a decision circuit readout, the reference signal from the edge generator; receiving, by the decision circuit readout, the raw decision signal from the decision circuit; and producing, by the decision circuit readout, a decision signal from the raw decision signal based on the reference signal to analyze temporal jitter.

A process for analyzing temporal jitter, the process comprising: producing, by a time delay controller, a control signal; receiving, by a time delay member, the control signal from the time delay controller; receiving, by the time delay member, a stimulus drive signal from the frequency divider; producing, by the time delay member, a delayed primary signal from the stimulus drive signal; receiving, by a delay measurement circuit, the delayed primary signal from the time delay member; receiving, by the delay measurement circuit, a primary signal from the primary photon detector; producing, by the delay measurement circuit, a time delay measurement signal from the delayed primary signal and the primary signal; producing, by an optical source, a photon pulse; receiving, by the primary photon detector, the photon pulse; producing, by the primary photon detector, the primary signal from the photon pulse; receiving, by a frequency divider, the primary signal from the primary photon detector; producing, by the frequency divider, the stimulus drive signal from the primary signal; communicating, by the frequency divider, the stimulus drive signal to the time delay member; receiving, by a detector, the photon pulse; producing, by the detector, a detector signal from the photon pulse; receiving, by the edge generator, the delayed primary signal from the time delay member; producing, by the edge generator, a reference signal from the delayed primary signal; receiving, by a decision circuit, the reference signal from the edge generator; receiving, by the decision circuit, the detector signal from the detector; producing, by the decision circuit, a raw decision signal from the detector signal such that a value of the raw decision signal depends on the reference signal; receiving, by a decision circuit readout, the reference signal from the edge generator; receiving, by the decision circuit readout, the raw decision signal from the decision circuit; and producing, by the decision circuit readout, a decision signal from the raw decision signal based on the reference signal to analyze temporal jitter.

BRIEF DESCRIPTION OF THE DRAWINGS

The following description cannot be considered limiting in any way. With reference to the accompanying drawings, like elements are numbered alike.

FIG. 1 shows a temporal jitter analyzer;

FIG. 3 shows a temporal jitter analyzer;

FIGS. 4A, 4B, 4C, 4D, 4E, and 4F, shows an electrical circuit for a temporal jitter analyzer, wherein FIG. 4A shows a global diagram that includes interconnections among individual blocks shown in FIGS. 4B-4F;

FIGS. 5A, 5B, 5C, 5D, and 5E, shows an electrical circuit for a temporal jitter analyzer, wherein FIG. 5A shows a global diagram that includes interconnections among individual blocks shown in FIGS. 5B-5E;

DETAILED DESCRIPTION

Figure 2:
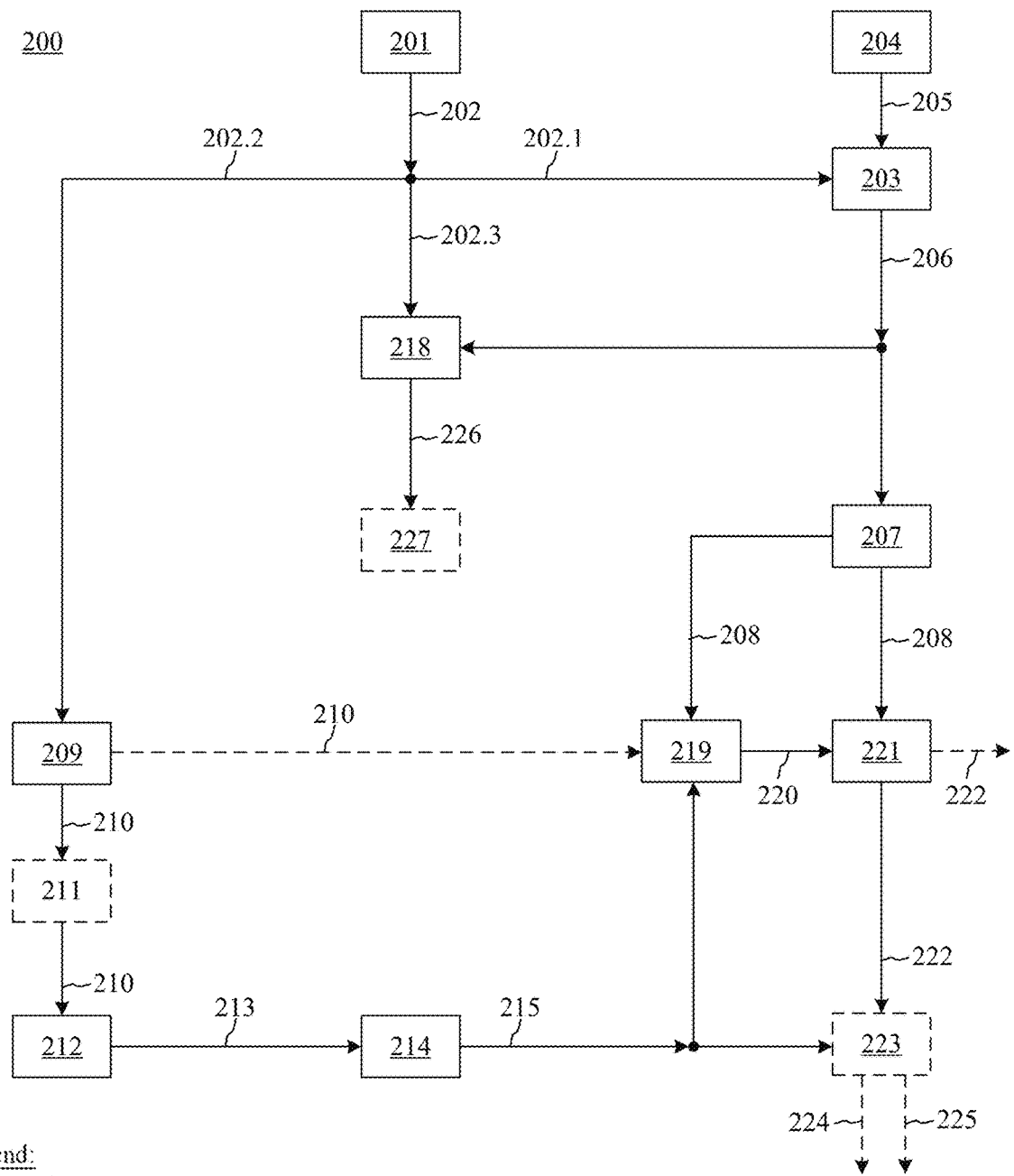
FIG. 2 shows a temporal jitter analyzer.
Figure 4A:
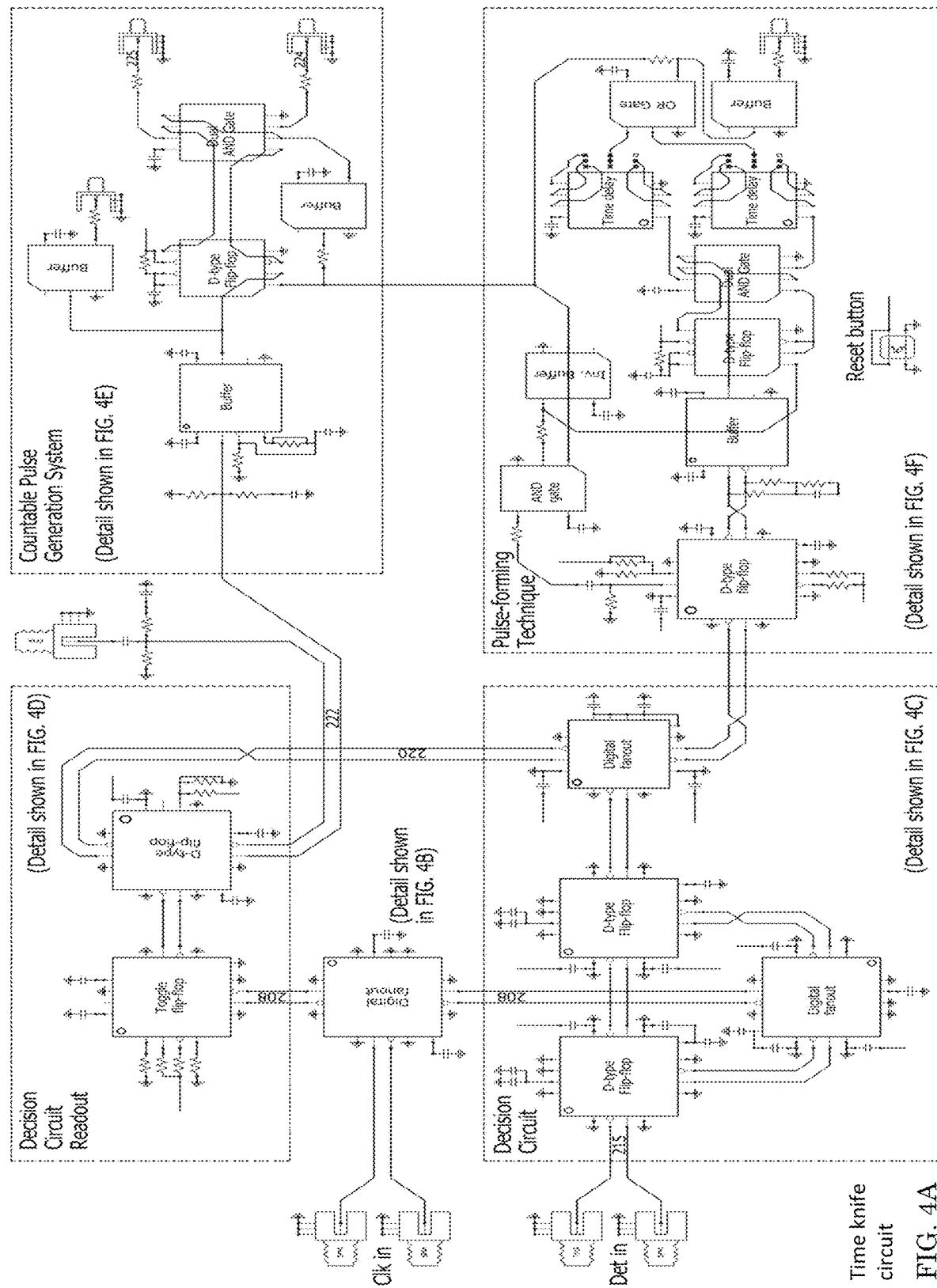
Figure 4B:
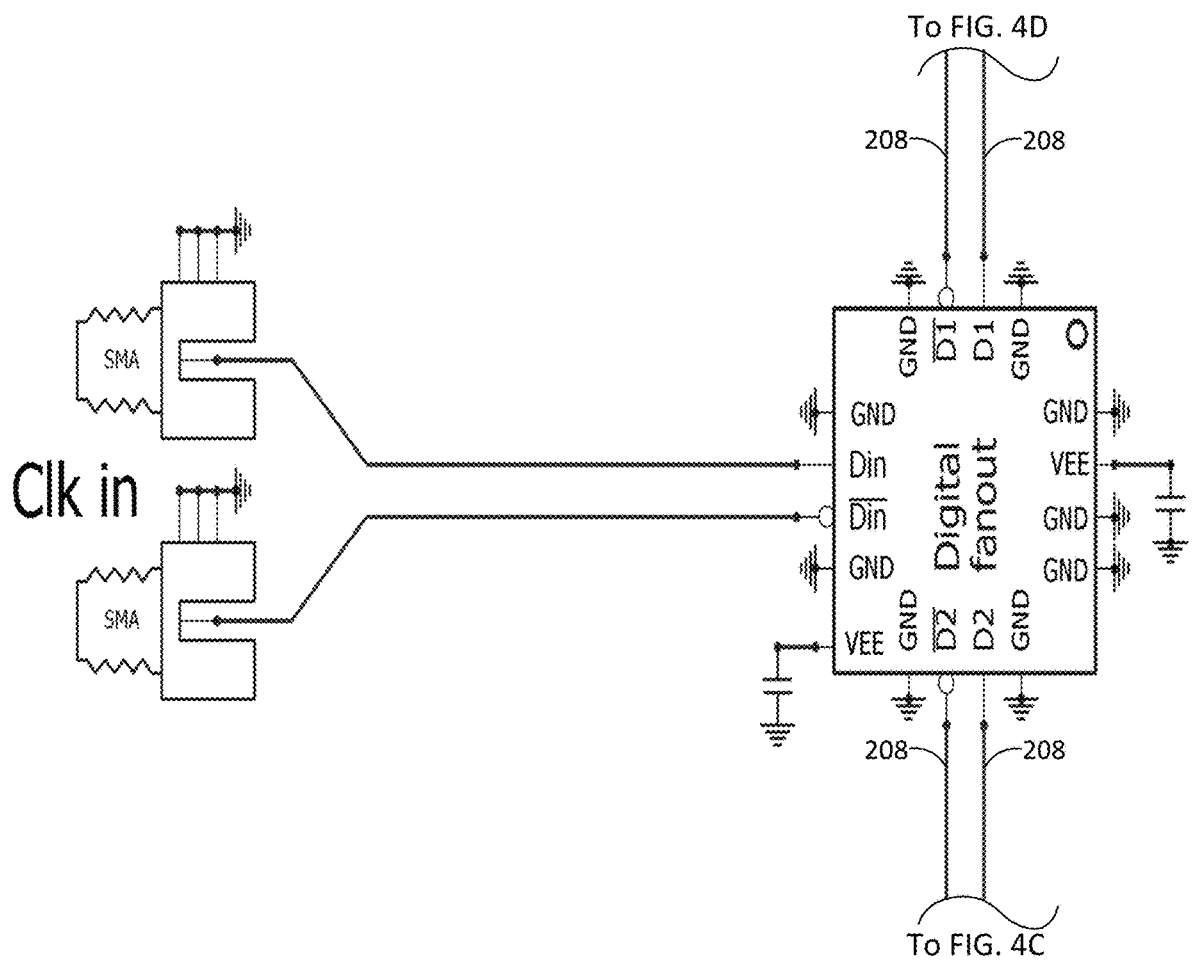
Figure 4C:
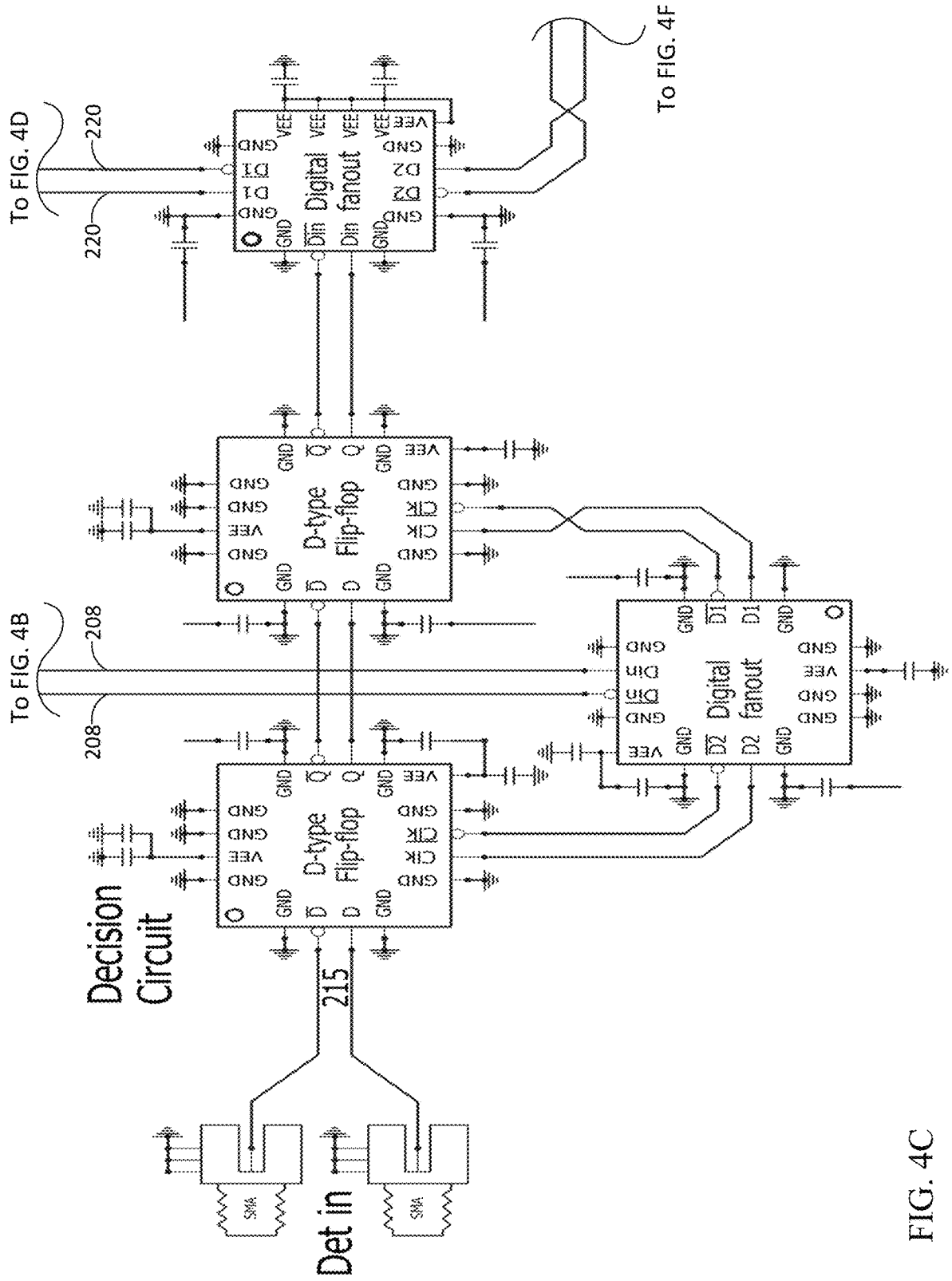
Figure 4D:
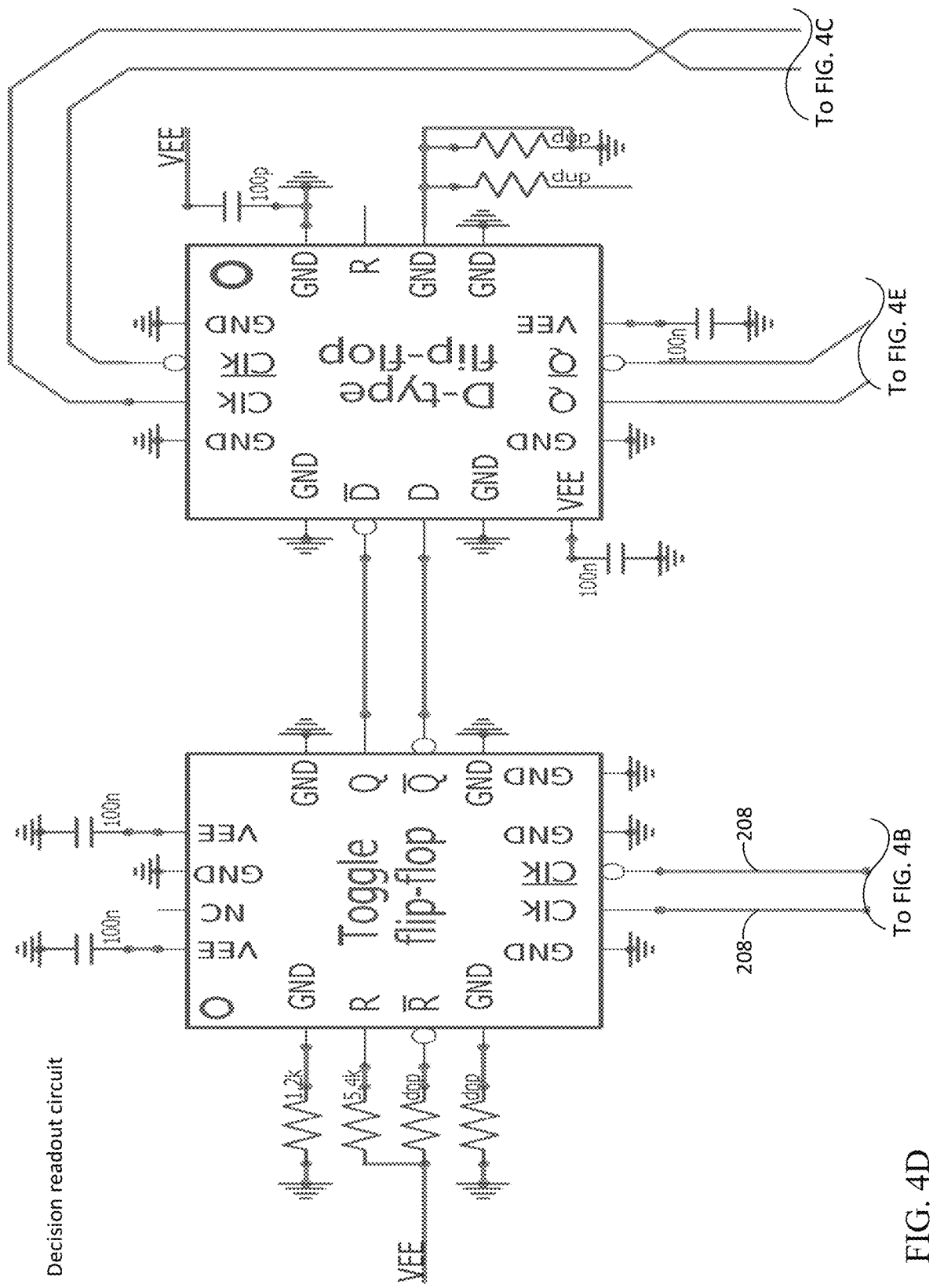
Figure 4E:
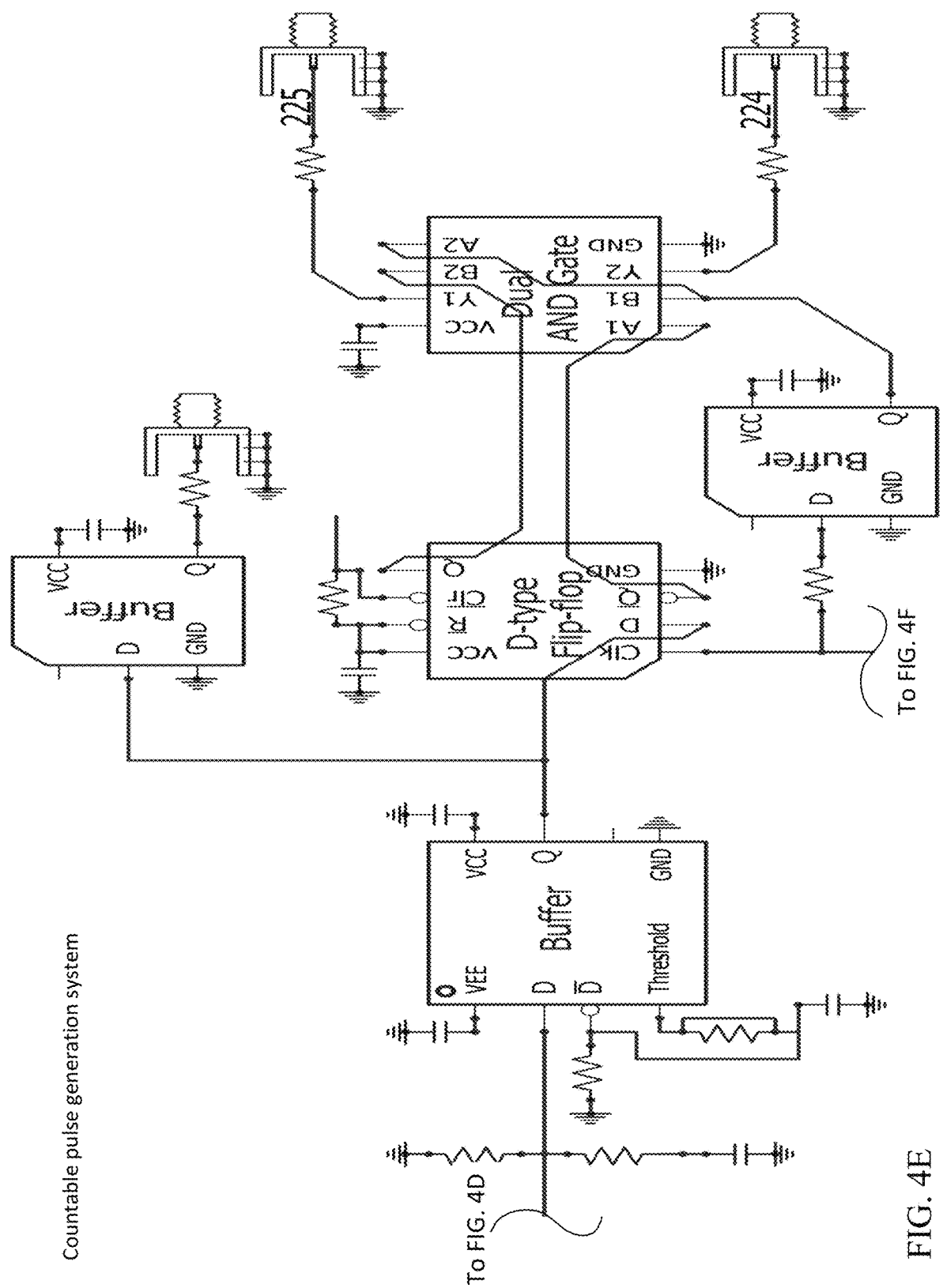
Figure 4F:
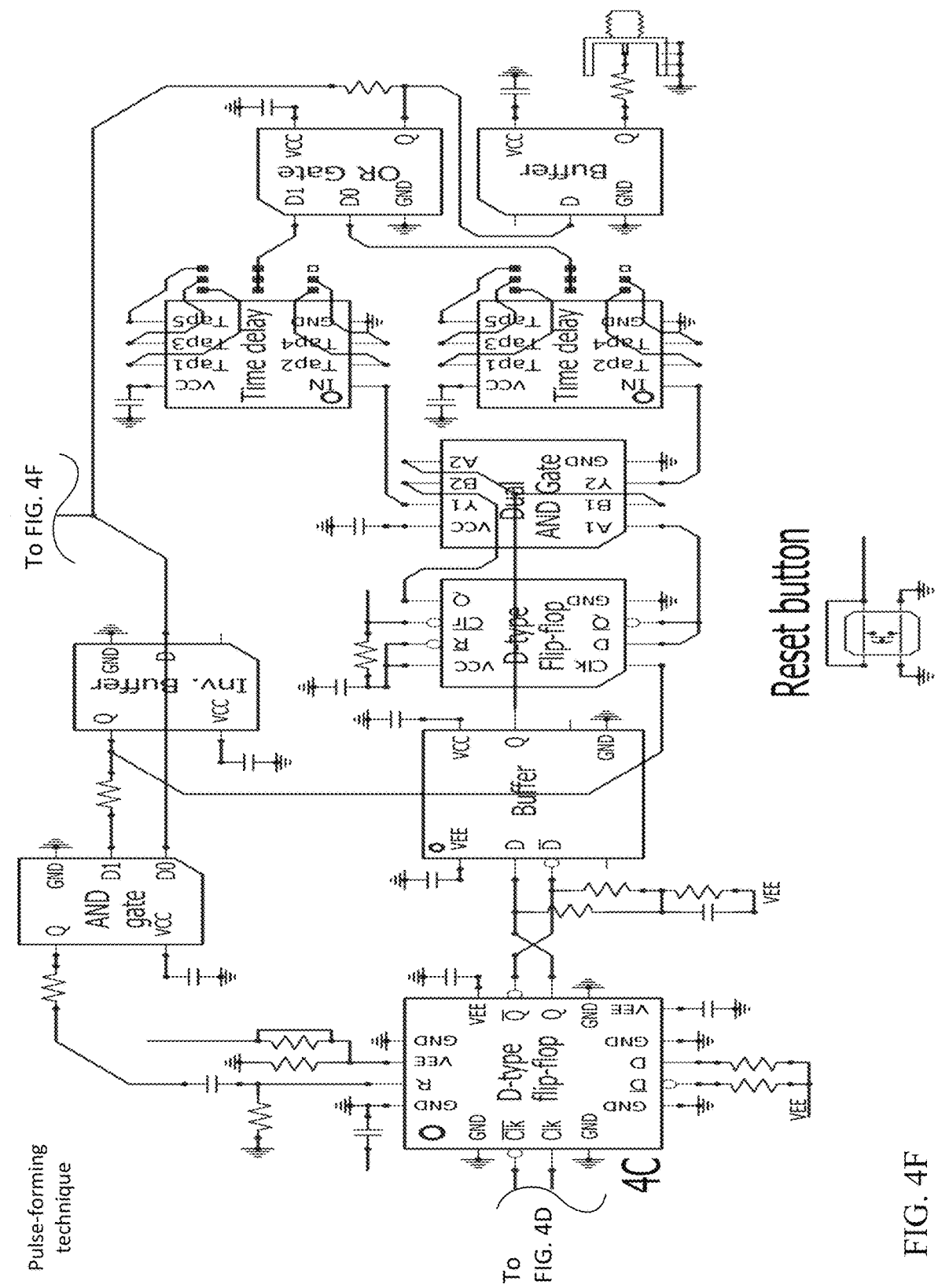
Figure 5A:
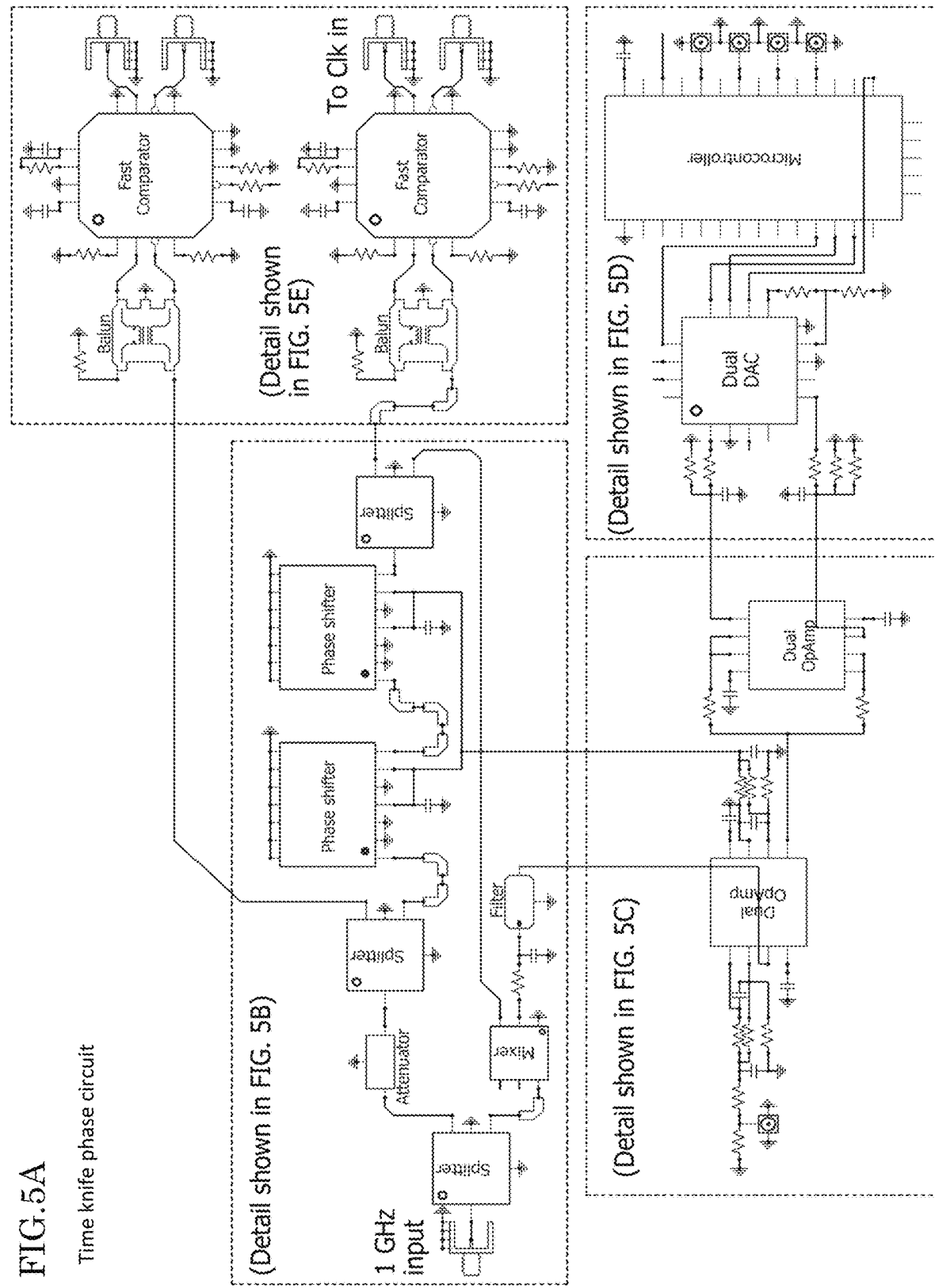
Figure 5B:
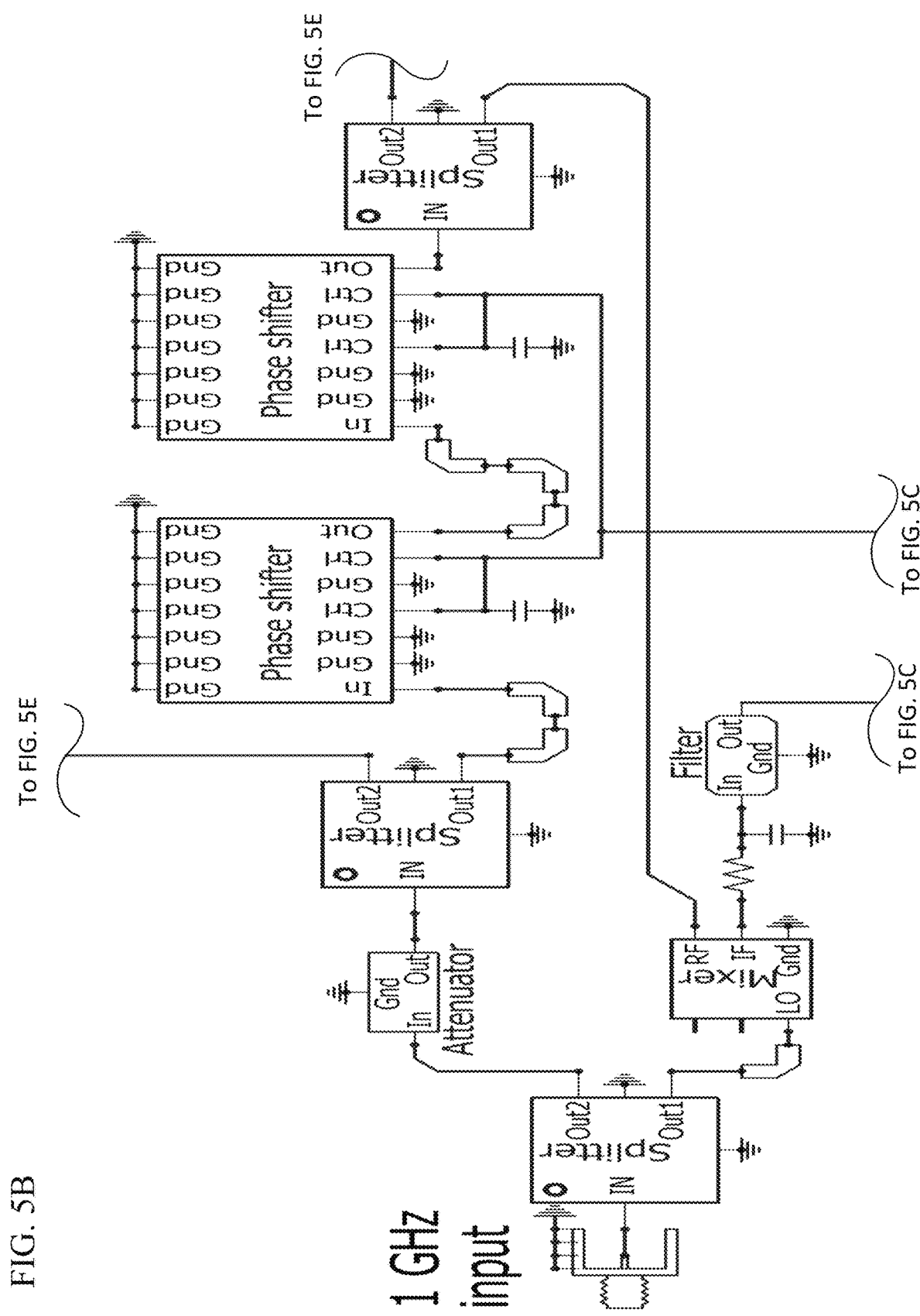
Figure 5C:
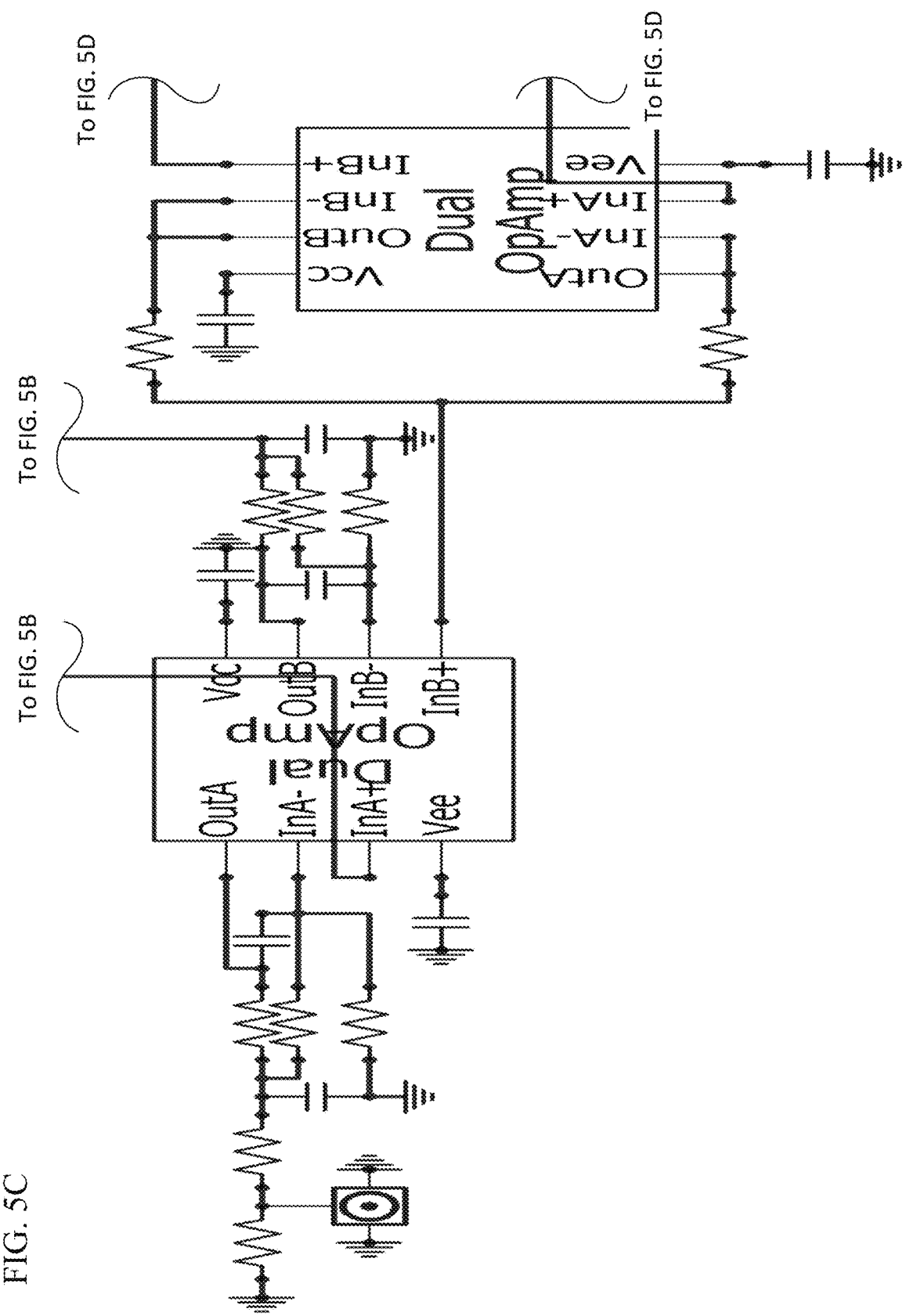
Figure 5D:
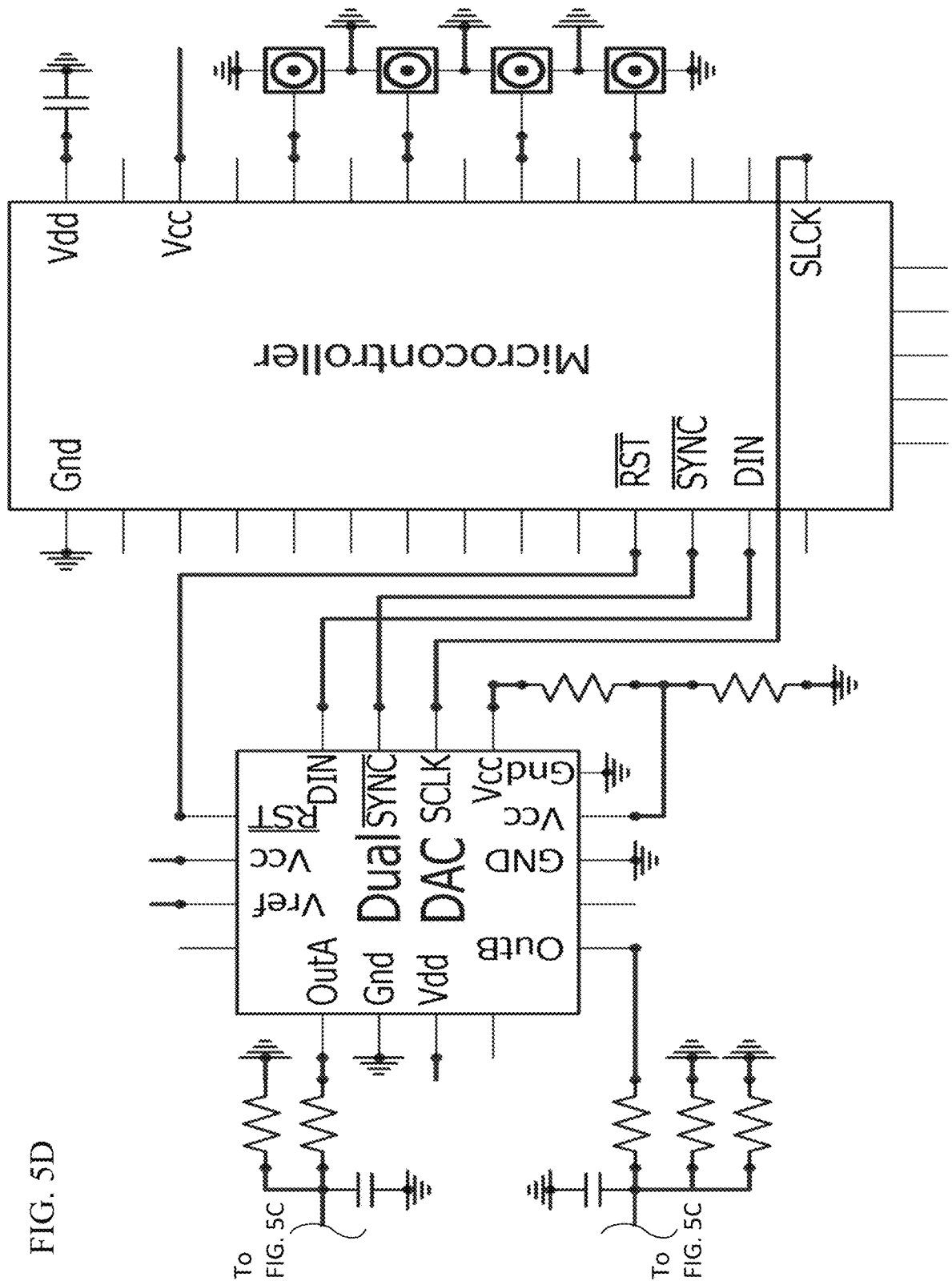
Figure 5E:
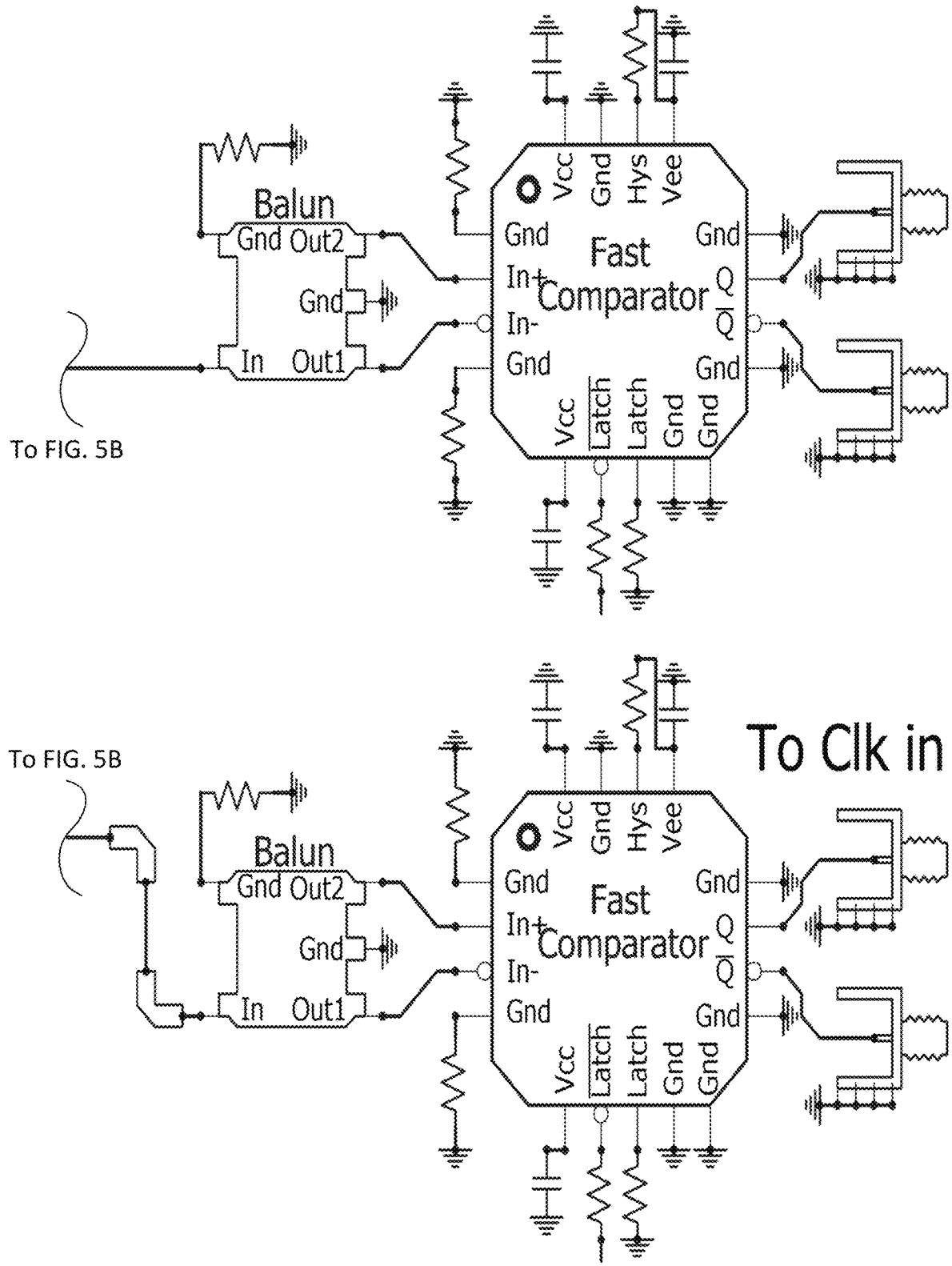

A detailed description of one or more embodiments is presented herein by way of exemplification and not limitation.

It should be appreciated that a temporal jitter analyzer and analyzing temporal jitter measure jitter, also referred to herein as temporal variation, of a repeated event. The temporal jitter analyzer and analyzing temporal jitter can include electronic circuitry that provides measurement resolution about hundreds of femtoseconds. It is contemplated that the temporal jitter analyzer and analyzing temporal jitter can determine the jitter of a response of a single-photon detector with high accuracy and can characterize operation of a single-photon detector that has jitter that is in the few-picosecond range.

Temporal jitter analyzer 200 analyzes temporal jitter of a signal such as primary signal 202. In an embodiment, with reference to FIG. 1 and FIG. 2, temporal jitter analyzer 200 includes time delay controller 204 that produces control signal 205; time delay member 203 in communication with time delay controller 204 and that: receives control signal 205 from time delay controller 204; receives first primary signal 202.1; and produces delayed primary signal 206 from first primary signal 202.1 such that delayed primary signal 206 is delayed from first primary signal 202.1 based on control signal 205; delay measurement circuit 218 in communication with time delay member 203 and that: receives delayed primary signal 206 from time delay member 203; receives third primary signal 202.3; and produces time delay measurement signal 226 from first primary signal 202.1 and third primary signal 202.3; edge generator 207 in communication with time delay member 203 and that receives delayed primary signal 206 from time delay member 203 and produces reference signal 208 from delayed primary signal 206; decision circuit 219 in communication with edge generator 207 and that: receives reference signal 208 from edge generator 207; receives detector signal 215; and produces raw decision signal 220 from detector signal 215 such that a value of raw decision signal 220 depends on reference signal 208; and decision circuit readout 221 in communication with edge generator 207 and the decision circuit 219 and that: receives reference signal 208 from edge generator 207; receives raw decision signal 220 from decision circuit 219; and produces decision signal 222 from raw decision signal 220 based on reference signal 208. The value of detector signal 215 refers to the position of an edge, wherein in the raw decision signal, "before" and "after" are encoded in the temporal position of an electrical edge.

In an embodiment, temporal jitter analyzer 200 includes countable pulse generator 223 in communication with decision circuit readout 221 and that: receives decision signal 222 from decision circuit readout 221; receives detector signal 215; and produces early pulse 224 and late pulse 225 from detector signal 215 based on decision signal 222.

In an embodiment, temporal jitter analyzer 200 includes signal generator 201 in communication with time delay member 203 and delay measurement circuit 218 and that produces primary signal 202 that is split into first primary signal 202.1 and third primary signal 202.3.

In an embodiment, temporal jitter analyzer 200 includes data medium 227 in communication with delay measurement circuit 218 and that receives time delay measurement signal 226 from delay measurement circuit 218.

In an embodiment, with reference to FIG. 2, temporal jitter analyzer 200 includes frequency divider 209 that: receives second primary signal 202.2; and produces stimulus drive signal 210 from second primary signal 202.2 such that stimulus drive signal 210 and second primary signal 202.2 have different frequencies.

In an embodiment, temporal jitter analyzer 200 includes optical source 212 in communication with frequency divider 209 and that: receives stimulus drive signal 210 from frequency divider 209; and produces photon pulse 213 from stimulus drive signal 210.

In an embodiment, temporal jitter analyzer 200 includes amplifier 211 in communication with frequency divider 209 and optical source 212 and that receives stimulus drive signal 210 from frequency divider 209 and amplifies stimulus drive signal 210 that is received by optical source 212.

In an embodiment, temporal jitter analyzer 200 includes detector 214 in communication with optical source 212 and that: receives photon pulse 213 from optical source 212; and produces detector signal 215 from photon pulse 213.

In an embodiment, decision circuit 219 receives stimulus drive signal 210 from frequency divider 209 and produces raw decision signal 220 based on stimulus drive signal 210.

In an embodiment, detector signal 215, first primary signal 202.1, and the third primary signal 202.3 have a stable phase relationship. It should be appreciated that primary signals (202.1, 202.2, 202.3) have a first phase, and detector signal 215 has a second phase, such that a phase difference between the first phase and the second phase is substantially constant, wherein the phase stability is less than the desired instrument response function of temporal jitter analyzer 200. This circumstance is referred to herein as a stable phase relationship.

In an embodiment, with reference to FIG. 3, temporal jitter analyzer 200 includes: time delay controller 204 that produces control signal 205; time delay member 203 in communication with time delay controller 204 and frequency divider 209 and that: receives control signal 205 from time delay controller 204; receives stimulus drive signal 210 from frequency divider 209; and produces delayed primary signal 206 from stimulus drive signal 210; a delay measurement circuit 218 in communication with time delay member 203 and primary photon detector 217 and that: receives delayed primary signal 206 from time delay member 203; receives primary signal 202 from primary photon detector 217; and produces time delay measurement signal 226 from delayed primary signal 206 and primary signal 202; an optical source 212 that produces photon pulse 213; the primary photon detector 217 in communication with optical source 212 and delay measurement circuit 218 and that: receives photon pulse 213; and produces primary signal 202 from photon pulse 213; a frequency divider 209 in communication with primary photon detector 217 and photon pulse 213 and that: receives primary signal 202 from primary photon detector 217; produces stimulus drive signal 210 from primary signal 202; and communicates stimulus drive signal 210 to time delay member 203; a detector 214 in communication with optical source 212 and that receives photon pulse 213 and produces detector signal 215 from photon pulse 213; an edge generator 207 in communication with time delay member 203 and that receives delayed primary signal 206 from time delay member 203 and produces reference signal 208 from delayed primary signal 206; a decision circuit 219 in communication with edge generator 207 and detector 214 and that: receives reference signal 208 from edge generator 207; receives detector signal 215 from detector 214; and produces raw decision signal 220 from detector signal 215 such that a value of raw decision signal 220 depends on reference signal 208; and a decision circuit readout 221 in communication with edge generator 207 and decision circuit 219 and that: receives reference signal 208 from edge generator 207; receives raw decision signal 220 from decision circuit 219; and produces decision signal 222 from raw decision signal 220 based on reference signal 208. In an embodiment, includes detector signal 215 and primary signal 202 have a stable phase relationship.

In an embodiment, temporal jitter analyzer 200 includes countable pulse generator 223 in communication with decision circuit readout 221 and detector 214 and that: receives decision signal 222 from decision circuit readout 221; receives detector signal 215 from detector 214; and produces an early pulse 224 and late pulse 225 from detector signal 215 based on decision signal 222.

In an embodiment, temporal jitter analyzer 200 includes optical beam splitter 216 in communication with primary photon detector 217, optical source 212, and detector 214 and that receives photon pulse 213 from optical source 212, splits photon pulse 213 that is received by primary photon detector 217 and detector 214.

In an embodiment, temporal jitter analyzer 200 includes data medium 227 in communication with delay measurement circuit 218 and that receives time delay measurement signal 226 from delay measurement circuit 218.

Temporal jitter analyzer 200 can be made from various elements and components. Signal generator 201 can include a device that produces electrical signals such as primary signal 202. Exemplary signal generators 201 include a low-phase-noise radio-frequency or microwave signal generator, an arbitrary waveform generator, a field programmable gate array, and the like. Primary signal 202 can be split into a plurality of signal such as first primary signal 202.1, second primary signal 202.2, and third primary signal 202.3 that can be identical except that a voltage amplitude or power can be different between such. Primary signal 202 can include an arbitrary periodic waveform with a tailorable magnitude, duty cycle, and frequency.

Time delay member 203 produces delayed primary signal 206 that is phase-shifted from primary signal 202 based on control signal 205 from time delay controller 204. In this manner, delayed primary signal 206 has a waveform similar to primary signal 202. Time delay member 203 can include a device that produces electrical signals such as delayed primary signal 206 and creates a phase shift among input signals. Exemplary time delay members 203 include an electrical phase shifter, a motor-controlled mechanically-variable-delay transmission line, and the like. A delay between delayed primary signal 206 and primary signal 202 can be from 1 femtosecond (fs) to 900 picoseconds (ps), specifically from 1 fs to 1 ps, and more specifically from 1 fs to 10 fs. Delayed primary signal 206 can be a sinusoid having a selected amplitude and frequency.

Figure 6:
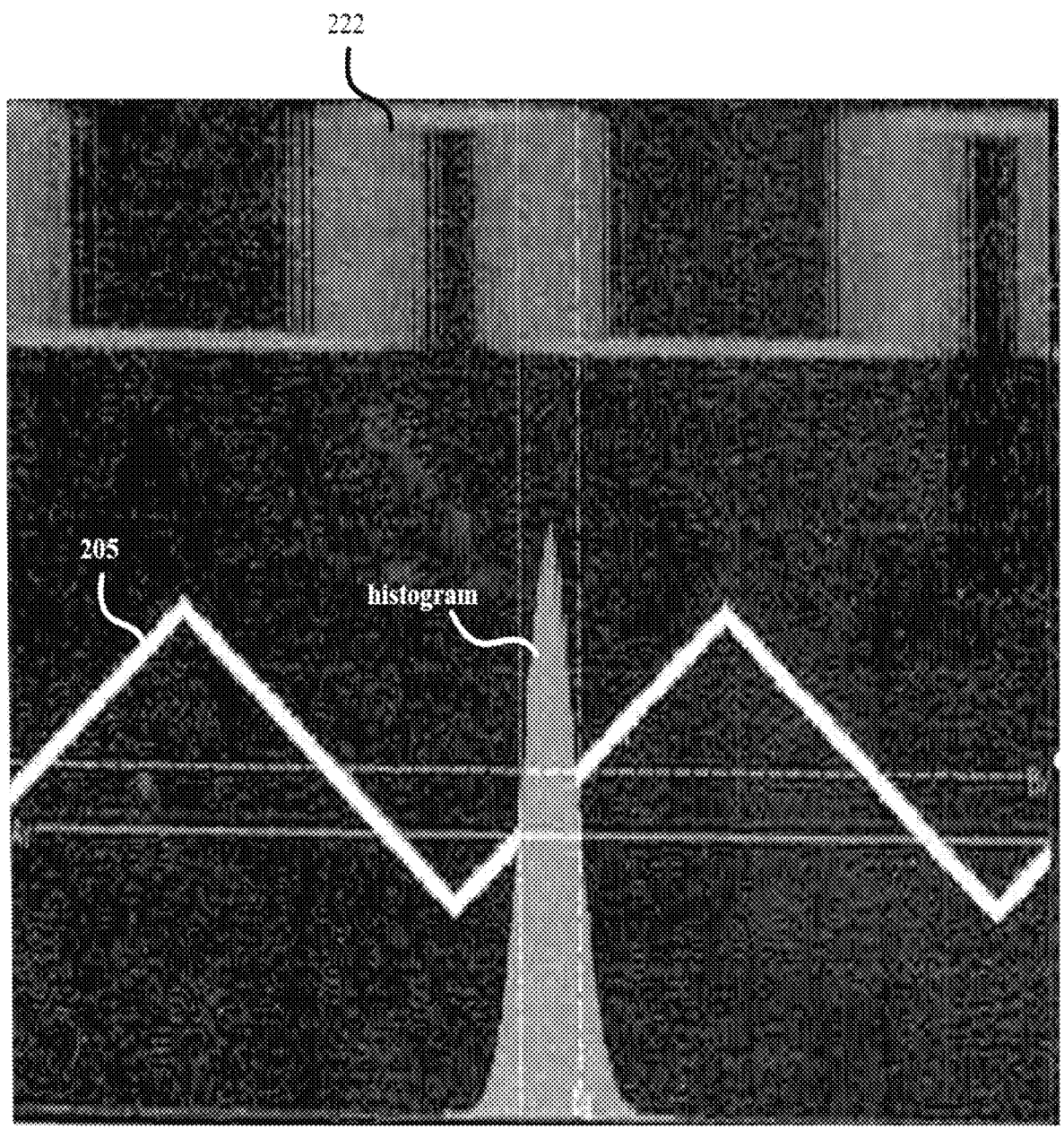
FIG. 6 shows a decision signal produces by a decision circuit, a control signal for controlling a relative position of a reference signal to a detector signal, and a histogram for number of events measured for which a width of the histogram is an instrument response function (IRF)

Time delay controller 204 can include a device that produces electrical signals such as control signal 205 for controlling phase shifts by time delay member 203. Exemplary time delay controllers include a digital-to-analog convertor (DAC), a microcontroller, a field-programmable gate array, and the like. Control signal 205 can include an arbitrary waveform with a tailorable magnitude, duty cycle, a frequency. Control signal 205 can be an electrical signal having an amplitude that varies smoothly to sweep the time delay through a range of values, and it can be an electrical signal with an amplitude that changes in discrete steps to cause the time delay to be at a first value for a selected time and thereafter change to a second value. An exemplary control signal 205 is shown in FIG. 6.

Edge generator 207 produces reference signal 208 based on delayed primary signal 206. Edge generator 207 receives delayed primary signal 206 that can be a sinusoid and makes square wave as reference signal 208 from the sinusoid, wherein the square wave has temporal edges that has a very fast rise time and very fast fall time such as a tens of picoseconds rise time or fall time. Exemplary edge generators can include various circuit elements such as a comparator or a limiting amplifier. Reference signal 208 can include an arbitrary periodic waveform with a tailorable magnitude, duty cycle, and frequency. In an embodiment, reference signal 208 is the square wave with a rise time that provides a time-knife edge for parsing temporal waveforms on the femtosecond or nanosecond timescale. A rise time and fall time reference signal 208 independently can be from 5 ps to 500 ps, specifically from 5 ps to 100 ps, and more specifically from 5 ps to 20 ps. Moreover, reference signal 208 can have a 50% duty cycle that alternates between two stable values with sharp transitions characterized by the rise and fall times.

Frequency divider 209 produces stimulus drive signal 210 from primary signal 202 and can be a clock divider, scaler, or prescaler that can include a circuit that receives primary signal 202 with frequency f1 and produces stimulus drive signal 210 with frequency f2=f1/m, wherein m is an arbitrary integer. It is contemplated that integer m is a multiple of two, e.g., 8. Accordingly, a frequency of primary signal 202 can be a multiple of the frequency of stimulus drive signal 210. Exemplary frequency dividers can include various circuit elements such as toggle flip-flops, phase-locked loops, and the like. The frequency of primary signal 202 can be, e.g., from 1 hertz (Hz) to 10 gigahertz (GHz), specifically from 1 kilohertz (kHz) 500 megahertz (MHz), and more specifically from 500 kHz to 10 MHz. Stimulus drive signal 210 can have a waveform similar to primary signal 202. In an embodiment, as shown in FIG. 2, stimulus drive signal 210 is communicated from frequency divider 209 and received by decision circuit 219 to determine directly the instrument response function instead of detecting detector signal 215.

It should be appreciated the temporal jitter analyzer 200 can include additional hardware, circuit elements, or electrical or optical signals for analyzing temporal jitter. Amplifier 211 can be electrically interposed between frequency divider 209 and optical source 212 to amplify stimulus drive signal 210 before receipt of stimulus drive signal 210 by optical source 212. Alternative or additional components can be included to condition signals and isolate various components.

Optical source 212 receives stimulus drive signal 210 and produces photon pulse 213 in response to stimulus drive signal 210. Exemplary optical sources include photon-generating devices, including lasers. Photon pulse 213 can have an optical power such that the average number of photons per photon pulse 213 is less than 1. Moreover, a temporal separation among photons in photon pulse 213 can be 100 ps to 1 s. A wavelength of photon pulse 213 can be in the X-ray, ultraviolet, visible, or infrared portion of the electromagnetic spectrum. In an embodiment, optical source 212 is a mode-locked laser that produces photon pulse 213 with pulse duration of 100 fs, or a vertical-cavity surface-emitting laser that produces a photon pulse 213 with pulse duration of 10 ps.

Detector 214 receives photon pulse 213. In an embodiment, detector 214 is a single-photon detector that produces detector signal 215. In some embodiments, detector signal 215 is an arbitrary signal that has a stable phase relationship with primary signal 202. In this manner, as shown in FIG. 3, temporal jitter analyzer 200 can be configured to analyze the temporal jitter of arbitrary electrical signals whether from an optical origin such as optical source 212 that produces photons such as photon pulse 213 or from an electrical source such as an electrical oscillator or an electronic transducer. Detector signal 215 can include an arbitrary waveform with a magnitude, duty cycle, or frequency that whose edge indicates the timing of an event such as the detection of a single photon by a single-photon detector or the arrival of a light pulse at another optical detector. Moreover, detector signal 215 can be characterized as having some uncertainty in the timing of the even that is contributed by the optical detector itself.

Optical beam splitter 216 can receive photon pulse 213 from optical source 212 and optically split photon pulse 213 for communication to detector 214 and primary photon detector 217. Optical beam splitter 216 can be a corner or mirror selected for distortion-free interaction with photon pulse 213.

Primary photon detector 217 receives photon pulse 213 and produces primary signal 202 from photon pulse 213 as shown in FIG. 3. In an embodiment, primary photon detector 217 is a standard photodetector. In this manner, as shown in FIG. 3, temporal jitter analyzer 200 can be configured to analyze temporal jitter of arbitrary electrical signals whether from an optical origin such as optical source 212 driven by signal generator 201 or a stabilized source in an absence of signal generator 201. Moreover, primary photon detector 217 can produce an output electrical signal in response to an input optical pulse that accurately indicates the arrival time of the optical pulse at the primary photon detector 217. This signal may have an arbitrary waveform, magnitude, and duty cycle.

Delay measurement circuit 218 receives primary signal 202 and delayed primary signal 206 and produces time delay measurement signal 226 based on comparing primary signal 202 to delayed primary signal 206. Delay measurement circuit 218 can include various circuit elements such as a mixer or a phase-locked loop. In an embodiment, delay measurement circuit 218 is a mixer. Time delay measurement signal 226 can include an arbitrary waveform with a magnitude, duty cycle, or frequency whose properties can be used to measure quantitatively the time delay of delayed primary signal 206 relative to primary signal 202 induced by delay element 203. Moreover, time delay measurement signal 226 can be digitized by an analog-to-digital convertor and provides a measure of the time delay with higher resolution than the timing jitter to be measured. Data medium 227 receives time delay measurement signal 226 from delay measurement circuit 218. Data medium 227 can include various elements such as amplifiers to amplify signals, circuit elements such as an analog-to-digital convertor to convert analog signals to digital signals, or digital or analog storage medium and computer processors for data storage, retrieval, and analysis.

Decision circuit 219 receives reference signal 208 and detector signal 215 and produces raw decision signal 220, based on a relative position of reference signal 208 to detector signal 215. Decision circuit 219 can include various circuit elements such as discrete digital flip-flops, comparators, fanouts, and the like. In an embodiment, decision circuit 219 is formed by two D-type digital flip-flops in series whose clock inputs are driven simultaneously by two simultaneous outputs from a clock-fanout circuit. Raw decision signal 220 can include an digital waveform with a magnitude, duty cycle, or frequency that has a digital value of either "0" or "1" ("low" or "high") sometime after each electrical-signal rising or falling edge in the reference signal 208 input to the decision circuit. Moreover, raw decision signal 220 can hold its output amplitude until the next electrical-signal rising or falling edge of reference signal 208 is input to the decision circuit.

Decision circuit readout 221 receives reference signal 208 and raw decision signal 220 and produces decision signal 222, based on reference signal 208 and raw decision signal 220. Decision circuit readout 221 can include various circuit elements such as D-type flip-flops, toggle flip-flops, fanouts, clock dividers, and the like. In an embodiment, decision circuit readout 221 is a D-type flip-flop whose data input given by the raw decision signal 220 and whose clock input is the output of a toggle flip-flop whose input is reference signal 208. Decision signal 222 can include an arbitrary waveform with a magnitude, duty cycle, or frequency that holds a stable digital voltage level ("low" or "high") until the signals input to decision circuit readout 221 cause it to change. An exemplary decision signal 222 is shown in FIG. 6.

Countable pulse generator 223 receives decision signal 222 and countable pulse generator 223 and produces early pulse 224 and late pulse 225, based on countable pulse generator 223 and decision signal 222. Countable pulse generator 223 can include various circuit elements such as pulse generators, digital AND gates, D-type flip-flops, digital OR gates, inverting buffers, non-inverting buffers, delay generators, and the like. In an embodiment, countable pulse generator 223 is two digital AND gates, each with its first input connected to the output of a pulse generator circuit that is triggered by detector signal 215 and one with its second input connected to the output of the decision circuit readout and the other with its second input connected to the output of an inverting buffer whose input is connected to the output of the decision circuit readout. Early pulse 224 and late pulse 225 independently can include an arbitrary waveform with a magnitude, duty cycle, or frequency that have pulse durations and voltage amplitudes that are suitable for counting with standard pulse-counting systems such as microcontrollers, universal pulse counters, and the like.

It is contemplated that an instrument response function (IRF) can be less than a picosecond, e.g., about 200 fs.

Temporal jitter analyzer 200 can be made in various ways. It should be appreciated that temporal jitter analyzer 200 includes a number of optical, electrical, or mechanical components, wherein such components can be interconnected and placed in communication (e.g., optical communication, electrical communication, mechanical communication, and the like) by physical, chemical, optical, or free-space interconnects. The components can be disposed on mounts that can be disposed on a bulkhead for alignment or physical compartmentalization. As a result, temporal jitter analyzer 200 can be disposed in a terrestrial environment or space environment.

In an embodiment, a process for making temporal jitter analyzer 200 includes: connecting signal generator 201 in communication with delay measurement circuit 218 by connecting the output of signal generator 201 to a microwave transmission line that is connected to the input port of a radio-frequency or microwave power splitter that has multiple output ports, with one of those output ports connected to a microwave transmission line that is connected to the input of the delay measurement circuit 218; connecting delay measurement circuit 218 in communication with data medium 227 by an electrical conductor connected to the input of a low-noise voltage amplifier whose output is connected to the analog input of an analog-to-digital convertor (ADC) controlled and readout by a microcontroller; connecting signal generator 201 in communication with time delay member 203 by connecting the output of the signal generator 201 to a microwave transmission line that is connected to the input port of a radio-frequency or microwave power splitter that has multiple output ports, with one of those output ports connected to a microwave transmission line that is connected to the input of time delay member 203; connecting signal generator 201 in communication with frequency divider 209 by connecting the output of the signal generator 201 to a microwave transmission line that is connected to the input port of a radio-frequency or microwave power splitter that has multiple output ports, with one of those output ports connected to a microwave transmission line that is connected to the input of frequency divider 209; connecting time delay controller 204 in communication with time delay member 203 by electrical conductor; connecting time delay member 203 to edge generator 207 by a microwave transmission line; connecting edge generator 207 in communication with decision circuit 219 by a microwave transmission line; connecting edge generator 207 in communication with decision circuit readout 221 by a microwave transmission line; connecting decision circuit 219 in communication with decision circuit readout 221 by a microwave transmission line; connecting frequency divider 209 in communication with amplifier 211 by a microwave transmission line; connecting amplifier 211 in communication with optical source 212 by a microwave transmission line; connecting optical source 212 in communication with detector 214 by optical fiber shielded from ambient light and passing through optical attenuators; connecting detector 214 in communication with decision circuit 219 by a microwave transmission line; connecting detector 214 in communication with countable pulse generator 223 by a microwave transmission line; and connecting decision circuit readout 221 in communication with countable pulse generator 223 by a microwave transmission line.

The process for making temporal jitter analyzer 200 also can include methods to stabilize the temperature of the circuitry, such as by mounting the circuit boards or components on a temperature-controlled thermally conducting surface such as an aluminum plate controlled by a Peltier element; methods to stabilize the electrical power that is supplied to each circuit element to eliminate electrical crosstalk between the circuit elements through the power supply, such as by adding ferrite conductors in series and bypass capacitors in parallel to the power supply network between the circuit elements.

Temporal jitter analyzer 200 has numerous advantageous and unexpected benefits and uses. In an embodiment, with reference to FIGS. 4A, 4B, 4C, 4D, 4E, and 4F and FIG. 5A, 5B, 5C, 5D, and 5E, and circuitry for temporal jitter analyzer 200 described below, a process for analyzing temporal jitter includes: producing, by time delay controller 204, control signal 205 by a microcontroller controlling a 16 bit digital-to-analog converter (DAC) whose reference voltage is temperature stabilized and whose output is amplified by a low-noise voltage amplifier; receiving, by time delay member 203, control signal 205 from time delay controller 204 by electrical conductor; receiving, by time delay member 203, first primary signal 202.1 by microwave transmission line; producing, by time delay member 203, delayed primary signal 206 from first primary signal 202.1 such that delayed primary signal 206 is delayed from first primary signal 202.1 based on control signal 205 by an analog phase-shifting circuit; receiving, by delay measurement circuit 218, delayed primary signal 206 from time delay member 203 by microwave transmission line; receiving, by delay measurement circuit 218, third primary signal 202.3 by microwave transmission line; producing, by delay measurement circuit 218, time delay measurement signal 226 from first primary signal 202.1 and third primary signal 202.3 by double-balanced microwave mixer whose output at the intermediate-frequency (IF) port is low-pass filtered and amplified by a low-noise voltage amplifier; receiving, by edge generator 207, delayed primary signal 206 from time delay member 203 by microwave transmission line; producing, by edge generator 207, reference signal 208 from delayed primary signal 206 by a gigahertz (GHz) bandwidth comparator circuit whose output exhibits rise and fall times that are less than 20 ps in duration from 10% of its full value to 90% of its full value; receiving, by decision circuit 219, reference signal 208 from edge generator 207 by microwave transmission line; receiving, by decision circuit 219, detector signal 215 by microwave transmission line; producing, by decision circuit 219, raw decision signal 220 from detector signal 215 such that a value of raw decision signal 220 depends on reference signal 208 by using a D-type flip-flop whose data input receives detector signal 215 and whose output is connected by microwave transmission line to the data input of a second D-type flip-flop (the two D-type flip-flops are in series) whose output is raw decision signal 220 and the clock inputs of both D-type flip-flops are driven synchronously by reference signal 208 distributed by a GHz bandwidth fanout circuit such that a voltage-level transition (low to high, or high to low) that occurs in detector signal 215 results in a voltage-level transition in raw decision signal 220 that occurs in either a first period of reference signal 208 or the next period of reference signal 208 according to whether or not the voltage-level transition in detector signal 215 occurred before or after the voltage-level transition in reference signal 208 that defined the start of the first period of reference signal 208; receiving, by decision circuit readout 221, reference signal 208 from edge generator 207 by microwave transmission line; receiving, by decision circuit readout 221, raw decision signal 220 from decision circuit 219 by microwave transmission line; and producing, by decision circuit readout 221, a decision signal 222 from raw decision signal 220 based on reference signal 208 to analyze temporal jitter by dividing the frequency of reference signal 208 by 2, for example by means of a toggle flip-flop, and applying the signal (with the divided frequency) to the data input of a D-type flip-flop clocked by raw decision signal 220 such that the output of the D-type flip-flop is one value (high or low) if the voltage-level transition in detector signal 215 occurred in a first period of reference signal 208 and the opposite value (low or high) if the voltage-level transition in detector signal 215 occurred in the next period of reference signal 208.

In an embodiment, the process for analyzing temporal jitter further includes: receiving by frequency divider 209, second primary signal 202.2 by microwave transmission line; producing, by frequency divider 209, stimulus drive signal 210 from second primary signal 202.2 by frequency division circuits, phase-locked loops, or toggle flip-flops; such that stimulus drive signal 210 and second primary signal 202.2 have different frequencies; receiving, by optical source 212, stimulus drive signal 210 from frequency divider 209 by microwave transmission line; and producing, by optical source 212, photon pulse 213 from stimulus drive signal 210 by driving a laser to produce an optical output pulse, triggering an output pulse from a gain-switched semiconductor laser, or triggering a pulse-picking mechanism to select a subset of pulses from a mode-locked laser.

In an embodiment, the process for analyzing temporal jitter further includes receiving, by decision circuit 219, stimulus drive signal 210 from frequency divider 209 by microwave transmission line; and producing, by decision circuit 219 raw decision signal 220 based on stimulus drive signal 210 by using a D-type flip-flop whose data input receives stimulus drive signal 210 and whose output is connected by microwave transmission line to the data input of a second D-type flip-flop (wherein the two D-type flip-flops are in series) whose output is raw decision signal 220 and the clock inputs of both D-type flip-flops are driven synchronously by reference signal 208 distributed by a GHz bandwidth fanout circuit such that a voltage-level transition (low to high, or high to low) that occurs in stimulus drive signal 210 results in a voltage-level transition in raw decision signal 220 that occurs in either a first period of reference signal 208 or the next period of reference signal 208 according to whether the voltage-level transition in stimulus drive signal 210 occurred before or after the voltage-level transition in reference signal 208 that defined the start of the first period of reference signal 208.

In an embodiment, the process for analyzing temporal jitter further includes receiving, by detector 214, photon pulse 213 from optical source 212 by optical fiber and optical attenuation; and producing, by detector 214, detector signal 215 from photon pulse 213 by photodetection, or single-photon detection.

In an embodiment, a process for analyzing temporal jitter includes: producing, by time delay controller 204, control signal 205 by digital to analog conversion; receiving, by time delay member 203, control signal 205 from the time delay controller 204 by electrical conduction; receiving, by time delay member 203, stimulus drive signal 210 from frequency divider 209 by microwave transmission line; producing, by time delay member 203, delayed primary signal 206 from stimulus drive signal 210 by radio-frequency phase shifters; receiving, by delay measurement circuit 218, delayed primary signal 206 from time delay member 203 by microwave transmission line; receiving, by delay measurement circuit 218, primary signal 202 from primary photon detector 217 by electrical conduction; producing, by delay measurement circuit 218, time delay measurement signal 226 from delayed primary signal 206 and primary signal 202 by double-balanced microwave mixer whose output at the intermediate-frequency (IF) port is low-pass filtered and amplified by a low-noise voltage amplifier; producing, by optical source 212, photon pulse 213 by driving a laser to produce an optical output pulse, or using the output pulses from a mode-locked laser; receiving, by primary photon detector 217, photon pulse 213 by optical fiber; producing, by primary photon detector 217, primary signal 202 from photon pulse 213 by photodetection and electrical amplification; receiving, by frequency divider 209, primary signal 202 from primary photon detector 217 by microwave transmission line; producing, by frequency divider 209, stimulus drive signal 210 from primary signal 202 by frequency-division circuitry, phase-locked loop circuitry, or toggle flip-flops; communicating, by frequency divider 209, stimulus drive signal 210 to time delay member 203 by microwave transmission line; receiving, by detector 214, photon pulse 213 by optical fiber and optical attenuation; producing, by detector 214, detector signal 215 from photon pulse 213 by photodetection or single-photon detection; receiving, by edge generator 207, delayed primary signal 206 from time delay member 203 by microwave transmission line; producing, by edge generator 207, reference signal 208 from delayed primary signal 206 by gigahertz (GHz) bandwidth voltage comparators or limiting amplifiers; receiving, by decision circuit 219, reference signal 208 from edge generator 207 by microwave transmission line; receiving, by decision circuit 219, detector signal 215 from detector 214 by microwave transmission line; producing, by decision circuit 219, raw decision signal 220 from detector signal 215 such that a value of raw decision signal 220 depends on reference signal 208 by using a D-type flip-flop whose data input receives detector signal 215 and whose output is connected by microwave transmission line to the data input of a second D-type flip-flop (the two D-type flip-flops are in series) whose output is raw decision signal 220, and the clock inputs of both D-type flip-flops are driven synchronously by reference signal 208 distributed by a GHz bandwidth fanout circuit such that a voltage-level transition (low to high, or high to low) that occurs in detector signal 215 results in a voltage-level transition in raw decision signal 220 that occurs in either a first period of reference signal 208 or the next period of reference signal 208 according to whether the voltage-level transition in detector signal 215 occurred before or after the voltage-level transition in reference signal 208 that defined the start of the first period of reference signal 208; receiving, by decision circuit readout 221, reference signal 208 from edge generator 207 by microwave transmission line; receiving, by decision circuit readout 221, raw decision signal 220 from decision circuit 219 by microwave transmission line; and producing, by decision circuit readout 221, decision signal 222 from raw decision signal 220 based on reference signal 208 to analyze temporal jitter by dividing the frequency of reference signal 208 by 2, for example by means of a toggle flip-flop, and applying that signal (with the divided frequency) to the data input of a D-type flip-flop clocked by raw decision signal 220 such that the output of the D-type flip-flop is one value (high or low) if the voltage-level transition in detector signal 215 occurred in a first period of reference signal 208 and the opposite value (low or high) if the voltage-level transition in detector signal 215 occurred in the next period of reference signal 208.

During the process for analyzing temporal jitter, temporal jitter analyzer 200 compares temporal uncertainty among two electrical signals (e.g., reference signal 208 and detector signal 215 to determine the temporal jitter of the combination of photon pulse 213 and detector 214, wherein a single-photon detector is stimulated by a weak, e.g., less than 1 photon per pulse, periodic pulsed optical source 212 with constant mean optical power per pulse of photon pulse 213; or reference signal 208 and stimulus drive signal 210 to determine an instrument response function of temporal jitter analyzer 200). Optical source 212 is synchronous with a repetitive electrical signal such as primary signal 202, which can be produced by a separate instrument such as a radio-frequency signal generator. The repetitive electrical signal, primary signal 202, can be controllably delayed in time by small increments over a range of time that spans the region of interest in the output detector signal 215 of detector 214. In analyzing temporal jitter, a voltage-level transition, referred to as an edge, in reference signal 208 is compared, using high-speed, low-jitter electronics such a discrete digital flip-flop circuits, to the detector signal 215. This comparison is carried out with decision circuit 219 that determines whether detector signal 215 occurred before or after the electrical edge of reference signal 208 from edge generator 207. Decision circuit 219 reports the result of each comparison by outputting an electrical edge in one of two periods of reference signal 208 as raw decision signal 220 that represents whether decision circuit 219 determined that detector signal 215 arrived before or after the arrival of the electrical edge of reference signal 208. The electrical edge position in raw decision signal 220 is interpreted by decision circuit readout 221 and converted to a digital voltage level in decision signal 222, in which a voltage level of "high" or "low," corresponds to "before" or "after" in raw decision signal 220. For each edge in detector signal 215, countable pulse generator 223 converts decision signal 222 into an electrical pulse in one of two output microwave transmission lines 224 and 225, corresponding to "before" or "after," and the sum of the number of electrical pulses on each output line for each delay setting of time delay member 203 is normalized to the total number of counts on both lines each delay setting. As the electrical edge of reference signal 208 is stepped, using the controllable time delay member 203 as controlled by primary signal 202, across the distribution of the temporal response of detector 214, the normalized counts per unit time of pulses of raw decision signal 220 from decision circuit 219 trace out shapes that as detector signal 215 occurs, at first, always after, and eventually, always before delayed voltage change. These shapes represent a convolution of jitter of detector 214 and uncertainty and variation in decision circuit 219/voltage change system.

Figure 7:
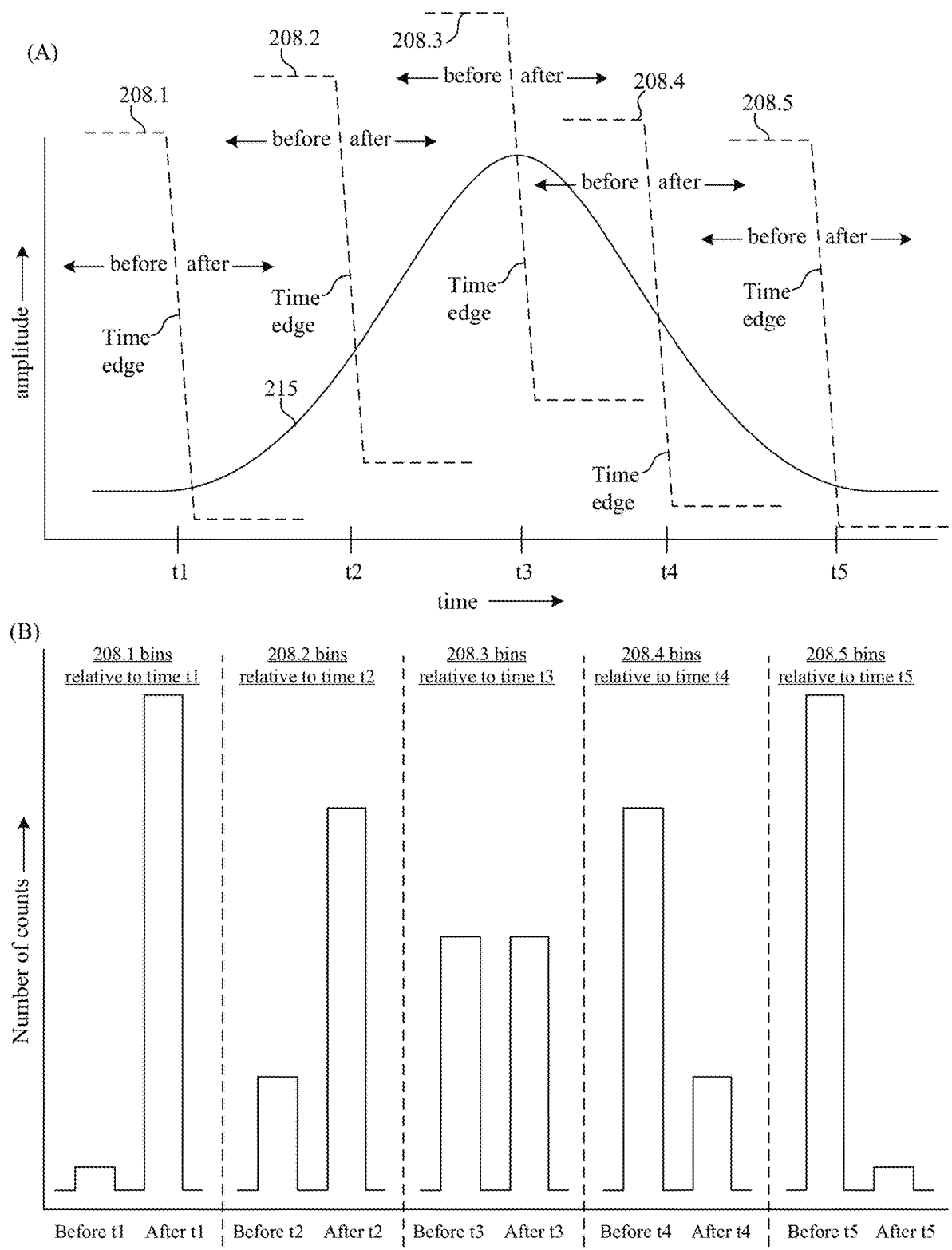
FIG. 7 shows a graph of amplitude versus time for a detector signal in panel A with various time-knife waveforms superimposed at a plurality of times; and in panel B a graph of number of counts for detection events before and after the time-knife curve for each time indicated in panel B.

With reference to FIG. 7, detector signal 215 produced, e.g., by detector 214 is compared with the time edge of reference signal 208 at a plurality of times (e.g., t1, . . . , t5), and a histogram can be formed from a number of events counted before the time edge of reference signal 208 and after the time edge of reference signal 208 as shown in panel B of FIG. 7 in relation to panel A of FIG. 7. Here, with respect to detector signal 215, first reference signal 208.1 has time edge about first time t1, with fewer events counted before time t1 than after time t1. The time delay is adjusted to produce second reference signal 208.2 with time edge at second time t2, wherein fewer events are counted before time t2 than after time t2. The time delay is adjusted to produce third reference signal 208.2 with time edge at third time t3, wherein about an equal number of events are counted before time t3 and after time t3. The time delay is further adjusted to produce fourth reference signal 208.4 with time edge at fourth time t4, wherein more events are counted before time t4 than after time t4. Again, the time delay is adjusted to produce fifth reference signal 208.5 with time edge at fifth time t5, wherein even more events are counted before time t5 than after time t5. It should be appreciated that the time edge can have a temporal span fewer than 1 ps, e.g., 200 fs, to provide a sharp temporal knife for parsing detector signal 215 into bins of detection events before and after the time edge of detector signal 215.

Temporal jitter analyzer 200 and analyzing temporal jitter provide an uncertainty and variation in decision circuit 219 and voltage change that can be low, e.g., less than 1 picosecond. The step size in the controllable time delay member 203 is small, e.g., in the femtosecond range, and the dwell time at each delay setting of time delay member 203 can be long, e.g., tens of seconds.

It is contemplated that temporal jitter analyzer 200 and analyzing temporal jitter can be used with repetitive signals, wherein there is a large ensemble of events of photon pulses 213 received by detector 214 that are distributed in time. Temporal jitter analyzer 200 and analyzing temporal jitter characterize that distribution. Moreover, temporal jitter analyzer 200 and analyzing temporal jitter can involve stably maintaining, for each delay setting of time delay member 203, timing between the electrical edge of reference signal 208 and photon pulse 213. Variations of this type can be induced on a relevant scale, e.g., in the femtosecond range, by temperature changes in the circuitry of temporal jitter analyzer 200 or other sources of instability.

Exemplary circuitry for temporal jitter analyzer 200 is shown in FIGS. 4A, 4B, 4C, 4D, 4E, 4F. Here, a "Det in" signal and a "Clk in" signal are input to the circuit via microwave transmission lines. The "Clk in" signal is sent to a high-speed digital fanout circuit that replicates the input signal on two synchronous outputs. One of those outputs is sent to the decision circuit, and the other output is sent to the decision-circuit readout. The decision circuit includes two D-type flip-flops connected in series and clocked synchronously by the output from the "Clk in" fanout via a second fanout. The "Det in" signal is input to the data input of the first D-type flip-flop in the decision circuit. According to operation of the D-type flip-flop, at each rising edge at the flip-flop's clock input, the voltage state of the "Det in" signal is transferred to that flip-flop's output. When a voltage-level transition in the "Det in" signal and the clock input are simultaneous, the output of the flip-flop is indeterminate. The second D-type flip-flop samples the output of the first D-type flip-flop, reducing the likelihood that the output of the second flip-flop is also indeterminate. As a result, a voltage-level transition in the "Det in" signal is shifted to one of two periods of the "Clk in" signal, either the "early" period, indicating that the transition in "Det in" occurred before the transition in the clock input, or the "late" period, indicating that the transition in the "Det in" signal occurred after the transition in the clock input. The decision circuit read out includes a toggle flip-flop, which produces an alternating voltage level for each period of the "Clk in" signal, and a D-type flip-flop whose clock input is connected to the output of the decision circuit via a third fanout. As a result, the position of the voltage-level transition in the output of the decision circuit is converted to a voltage level (either "high" or "low") at the output of the decision circuit readout. This voltage level is input to the countable pulse generation system, that can include a D-type flip-flop, two AND gates, and two buffers, and that allows an electrical pulse to pass through one of the two AND gates according to the voltage level, thereby outputting countable pulses for the user. The pulses are formed from the second output of the third fanout using pulse-forming techniques based on a resettable flip-flop and time-delay elements. A "reset" button, e.g., when pressed by the user, can reset the flip-flops if an unexpected latching of the state of the flip-flops. Further, a phase circuit for providing temporal delays is shown in FIGS. 5A, 5B, 5C, 5D, and 5E, wherein a microwave signal at 1 GHz is applied to the input. This signal is split into three microwave transmission lines. The first goes to the LO port of a mixer for making a homodyne measurement of the phase shift. The second is sent through two analog phase shifters that are controlled by two digital-to-analog convertors (DACs), one for coarse and one for fine control of the phase shift. The outputs of the two DACs are summed and buffered with a non-inverting amplifier. The DACs are controlled digitally by a microcontroller mounted on the board. The output of the phase shifters is split into two microwave transmission lines, one goes to the mixer for the homodyne measurement of the applied phase shift, and the other is sent through a balun to the input of a fast comparator to form a square wave with fast edge transitions. The output of this fast comparator serves as the "Clk in" signal to the temporal jitter analyzer circuit described above. The third of the three-fold split 1 GHz input signal is sent directly to a balun and a second fast comparator. The output of this comparator can be used to measure the instrument response function of the temporal jitter analyzer circuit by having the "Clk in" and the "Det in" inputs be supplied by the same oscillator. This type of self-comparison measures an instrument response function. Exemplary signals obtained by these circuits are shown in FIG. 6 wherein a screen shot from an oscilloscope is shown. The yellow triangle wave (control signal 205) is the analog control signal applied to the phase shifters and indicates that the phase delay is being ramped back and forth in a periodic manner. The green trace (decision signal 222) is the output of the decision readout circuit and exhibits regions of stability where the voltage level is constant (either high or low) and regions of instability where the voltage level fluctuates back and forth between high and low. The stable regions indicate that for these phase delays the decision circuit is definitively measuring the same result (either "before" or "after"), whereas the regions of uncertainty are where the decision circuit is not able to definitively determine "before" from "after." The blue histogram is a measure of the density of one of these regions of uncertainty and provides a measure of the instrument response function, or resolution, of the temporal jitter analyzer.

Temporal jitter analyzer 200 and processes disclosed herein have numerous beneficial uses, including providing high-resolution time-domain measurements of the variation in periodic events, a simple method for self-characterization to determine the systems instrument response function, providing high-resolution jitter characterization measurements with off-the-shelf electrical components, using simple and standard electrical pulse counters to perform high-resolution jitter measurements of fast transient events, serving as the controlling master oscillator driving the optical source used to probe a detector under test or to have the periodic signal be provided by another source, such as a mode-locked laser, and performing measurements over an essentially arbitrary amount of time limited only by the stability of the system and the range of the pulse counters. Advantageously, temporal jitter analyzer 200 overcomes limitations or technical deficiencies of conventional devices and conventional processes for jitter characterization such as the need for finely-tuned time-to-amplitude conversion systems or extremely high-bandwidth interpolated digital sampling systems, both of which are complex and expensive systems to implement, particularly when resolution in the few-picosecond range or less is desired. Further, to achieve high resolution performance, conventional processes require specialized integrated circuits that are prohibitive to access or replace. Temporal jitter analyzer 200 overcomes this necessity.

Temporal jitter analyzer 200 is a compact, specialized, high-accuracy, low-cost, high-resolution apparatus for analyzing temporal jitter. Temporal jitter analyzer 200 and processes herein unexpectedly exhibit an instrument response function below 1 ps, as low as 200 fs. This degree of resolution in a temporal jitter characterization measurement exceeds what can be achieved with conventional processes. Moreover, temporal jitter analyzer 200 is an advance in the temporal jitter characterization methods.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A temporal jitter analyzer for analyzing temporal jitter, the temporal jitter analyzer comprising:
    a time delay controller that produces a control signal;
    a time delay member in communication with the time delay controller and that:
        receives the control signal from the time delay controller;
        receives a first primary signal; and
        produces a delayed primary signal from the first primary signal such that delayed primary signal is delayed from first primary signal based on control signal;
    a delay measurement circuit in communication with the time delay member and that:
        receives the delayed primary signal from the time delay member;
        receives a third primary signal; and
    produces a time delay measurement signal from the first primary signal and the third primary signal;
    an edge generator in communication with the time delay member and that receives the delayed primary signal from the time delay member and produces a reference signal from the delayed primary signal;
    a decision circuit in communication with the edge generator and that:
        receives the reference signal from the edge generator;
        receives a detector signal; and
        produces a raw decision signal from the detector signal such that a value of the raw decision signal depends on the reference signal; and
    a decision circuit readout in communication with the edge generator and the decision circuit and that:
        receives the reference signal from the edge generator;
        receives the raw decision signal from the decision circuit; and
    produces a decision signal from the raw decision signal based on the reference signal.

2. The temporal jitter analyzer of claim 1, further comprising a countable pulse generator in communication with the decision circuit readout and that:
    receives the decision signal from the decision circuit readout;
    receives the detector signal; and
    produces an early pulse and a late pulse from the detector signal based on the decision signal.

3. The temporal jitter analyzer of claim 1, further comprising a signal generator in communication with the time delay member and the delay measurement circuit and that produces a primary signal that is split into the first primary signal and the third primary signal.

4. The temporal jitter analyzer of claim 1, further comprising a data medium in communication with the delay measurement circuit and that receives the time delay measurement signal from the delay measurement circuit.

5. The temporal jitter analyzer of claim 1, further comprising a frequency divider that:
    receives a second primary signal; and
    produces an stimulus drive signal from the second primary signal such that the stimulus drive signal and the second primary signal have different frequencies.

6. The temporal jitter analyzer of claim 5, further comprising an optical source in communication with the frequency divider and that:
    receives the stimulus drive signal from the frequency divider; and
    produces a photon pulse from the stimulus drive signal.

7. The temporal jitter analyzer of claim 6, further comprising a detector in communication with the optical source and that:
    receives the photon pulse from the optical source; and
    produces the detector signal from the photon pulse.

8. The temporal jitter analyzer of claim 5, further comprising an amplifier in communication with the frequency divider and the optical source and that receives the stimulus drive signal from the frequency divider and amplifies the stimulus drive signal that is received by the optical source.

9. The temporal jitter analyzer of claim 5, wherein decision circuit receives the stimulus drive signal from the frequency divider and produces the raw decision signal based on the stimulus drive signal.

10. The temporal jitter analyzer of claim 1, wherein the detector signal, the first primary signal, and the third primary signal have a stable phase relationship.

11. A temporal jitter analyzer for analyzing temporal jitter, the temporal jitter analyzer comprising:
    a time delay controller that produces a control signal;
    a time delay member in communication with the time delay controller and a frequency divider and that:
        receives the control signal from the time delay controller;
        receives a stimulus drive signal from the frequency divider; and
        produces a delayed primary signal from the stimulus drive signal;
    a delay measurement circuit in communication with the time delay member and a primary photon detector and that:
        receives the delayed primary signal from the time delay member;
        receives a primary signal from the primary photon detector; and produces a time delay measurement signal from the delayed primary signal and the primary signal;
an optical source that produces a photon pulse;
the primary photon detector in communication with the optical source and the delay measurement circuit and that:
receives the photon pulse; and
produces the primary signal from the photon pulse;
a frequency divider in communication with the primary photon detector and the photon pulse and that:
receives the primary signal from the primary photon detector;
produces the stimulus drive signal from the primary signal; and
communicates the stimulus drive signal to the time delay member;
a detector in communication with the optical source and that receives the photon pulse a produces a detector signal from the photon pulse;
an edge generator in communication with the time delay member and that receives the delayed primary signal from the time delay member and produces a reference signal from the delayed primary signal;
a decision circuit in communication with the edge generator and the detector and that:
receives the reference signal from the edge generator;
receives the detector signal from the detector; and
produces a raw decision signal from the detector signal such that a value of the raw decision signal depends on the reference signal; and
a decision circuit readout in communication with the edge generator and the decision circuit and that:
receives the reference signal from the edge generator;
receives the raw decision signal from the decision circuit; and
produces a decision signal from the raw decision signal based on the reference signal.

12. The temporal jitter analyzer of claim 11, further comprising a countable pulse generator in communication with the decision circuit readout and the detector and that:
receives the decision signal from the decision circuit readout;
receives the detector signal from the detector; and
produces an early pulse and a late pulse from the detector signal based on the decision signal.

13. The temporal jitter analyzer of claim 11, further comprising an optical beam splitter in communication with the primary photon detector, the optical source, and the detector and that receives the photon pulse from the optical source, splits the photon pulse that is received by the primary photon detector and detector.

14. The temporal jitter analyzer of claim 11, further comprising a data medium in communication with the delay measurement circuit and that receives the time delay measurement signal from the delay measurement circuit.

15. The temporal jitter analyzer of claim 11, wherein the detector signal and the primary signal have a stable phase relationship.

16. A process for analyzing temporal jitter, the process comprising:
producing, by a time delay controller, a control signal;
receiving, by a time delay member, the control signal from the time delay controller;
receiving, by the time delay member, a first primary signal;
producing, by the time delay member, a delayed primary signal from the first primary signal such that delayed primary signal is delayed from first primary signal based on control signal;
receiving, by a delay measurement circuit, the delayed primary signal from the time delay member;
receiving, by the delay measurement circuit, a third primary signal;
producing, by the delay measurement circuit, a time delay measurement signal from the first primary signal and the third primary signal;
receiving, by an edge generator, the delayed primary signal from the time delay member;
producing, by the edge generator, a reference signal from the delayed primary signal;
receiving, by a decision circuit, the reference signal from the edge generator;
receiving, by the decision circuit, detector signal;
producing, by the decision circuit, a raw decision signal from the detector signal such that a value of the raw decision signal depends on the reference signal;
receiving, by a decision circuit readout, the reference signal from the edge generator;
receiving, by the decision circuit readout, the raw decision signal from the decision circuit; and
producing, by the decision circuit readout, a decision signal from the raw decision signal based on the reference signal to analyze temporal jitter.

17. The process of claim 16, further comprising:
receiving by a frequency divider, a second primary signal;
producing, by the frequency divider, a stimulus drive signal from the second primary signal such that the stimulus drive signal and the second primary signal have different frequencies;
receiving, by an optical source, the stimulus drive signal from the frequency divider; and
producing, by the optical source, a photon pulse from the stimulus drive signal.

18. The process of claim 17, further comprising receiving, by the decision circuit, the stimulus drive signal from the frequency divider; and
producing, by the decision circuit the raw decision signal based on the stimulus drive signal.

19. The process of claim 18, further comprising:
receiving, by a detector, the photon pulse from the optical source; and
producing, by the detector, the detector signal from the photon pulse.

20. A process for analyzing temporal jitter, the process comprising:
producing, by a time delay controller, a control signal;
receiving, by a time delay member, the control signal from the time delay controller;
receiving, by the time delay member, a stimulus drive signal from the frequency divider;
producing, by the time delay member, a delayed primary signal from the stimulus drive signal;
receiving, by a delay measurement circuit, the delayed primary signal from the time delay member;
receiving, by the delay measurement circuit, a primary signal from the primary photon detector;
producing, by the delay measurement circuit, a time delay measurement signal from the delayed primary signal and the primary signal;
producing, by an optical source, a photon pulse;
receiving, by the primary photon detector, the photon pulse;

producing, by the primary photon detector, the primary signal from the photon pulse;
receiving, by a frequency divider, the primary signal from the primary photon detector;
producing, by the frequency divider, the stimulus drive signal from the primary signal;
communicating, by the frequency divider, the stimulus drive signal to the time delay member;
receiving, by a detector, the photon pulse;
producing, by the detector, a detector signal from the photon pulse;
receiving, by the edge generator, the delayed primary signal from the time delay member;
producing, by the edge generator, a reference signal from the delayed primary signal;
receiving, by a decision circuit, the reference signal from the edge generator;
receiving, by the decision circuit, the detector signal from the detector;
producing, by the decision circuit, a raw decision signal from the detector signal such that a value of the raw decision signal depends on the reference signal;
receiving, by a decision circuit readout, the reference signal from the edge generator;
receiving, by the decision circuit readout, the raw decision signal from the decision circuit; and
producing, by the decision circuit readout, a decision signal from the raw decision signal based on the reference signal to analyze temporal jitter.

* * * * *